(12) United States Patent
Yamada et al.

(10) Patent No.: US 6,663,015 B2
(45) Date of Patent: Dec. 16, 2003

(54) PIEZOELECTRIC DEVICE FOR INJECTOR

(75) Inventors: Yutaka Yamada, Suzuka (JP);
Masayuki Kobayashi, Kuwana (JP);
Naoyuki Kawazoe, Hashima (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/873,294

(22) Filed: Jun. 5, 2001

(65) Prior Publication Data

US 2001/0047796 A1 Dec. 6, 2001

(30) Foreign Application Priority Data

| Jun. 6, 2000 | (JP) | 2000-169524 |
| Dec. 28, 2000 | (JP) | 2000-400203 |
| May 23, 2001 | (JP) | 2001-154212 |

(51) Int. Cl.$^7$ ............................................... B05B 1/08
(52) U.S. Cl. ..................... 239/102.1; 239/102.2; 239/533.2; 239/585.1; 239/533.1
(58) Field of Search ................... 239/102.1, 102.2, 239/533.1, 533.2, 585.1, 585.3, 585.4, 585.5, 88–95; 310/328, 363, 366, 358; 123/498; 251/129.06

(56) References Cited

U.S. PATENT DOCUMENTS

| 5,163,209 A | * 11/1992 | Harada et al. ............. 29/25.35 |
| 5,233,260 A | * 8/1993 | Harada et al. ............. 310/328 |
| 5,645,753 A | 7/1997 | Fukuoka et al. |
| 6,012,207 A | * 1/2000 | Ogiso et al. ............. 29/25.35 |
| 6,414,417 B1 | * 7/2002 | Tsuyoshi et al. ............. 310/366 |

FOREIGN PATENT DOCUMENTS

| DE | 4201937 A1 | * 7/1992 | ................. 257/415 |
| EP | 0921302 | 9/1999 | |
| JP | 59-135784 | 8/1984 | |
| JP | 59-204288 | 11/1984 | |
| JP | 2-251185 | 10/1990 | |
| JP | 8-167746 | 6/1996 | |
| JP | 10-229227 | 8/1998 | |
| JP | 11-229993 | 8/1999 | |

OTHER PUBLICATIONS

"Large Piezoelectric Monolithic Multilayer Actuators", H. Hellebrand, D. Kramer, I. Probst, A. Wolff, K. Lubitz Siemens AG, Muchen, Germany; Conference Proceedings, Jun. 15–17, 1994, pp. 119–123.

* cited by examiner

*Primary Examiner*—Davis Hwu
(74) *Attorney, Agent, or Firm*—Nixon & Vanderhye P.C.

(57) ABSTRACT

A piezoelectric device which is applicable, for example, as a drive source for a fuel injector comprises a plurality of piezoelectric layers and a plurality of inner electrode layers stacked alternately with each other. The outer peripheral side surfaces are formed with a pair of outer electrode layers electrically turned on alternately in such a manner that the inner electrode layers located adjacently to each other through the piezoelectric layers have different polarities. Second outer electrode layers configured of a conductive material having a larger breaking elongation than the first outer electrode layers, respectively, are formed on a pair of the first outer electrode layers.

26 Claims, 26 Drawing Sheets

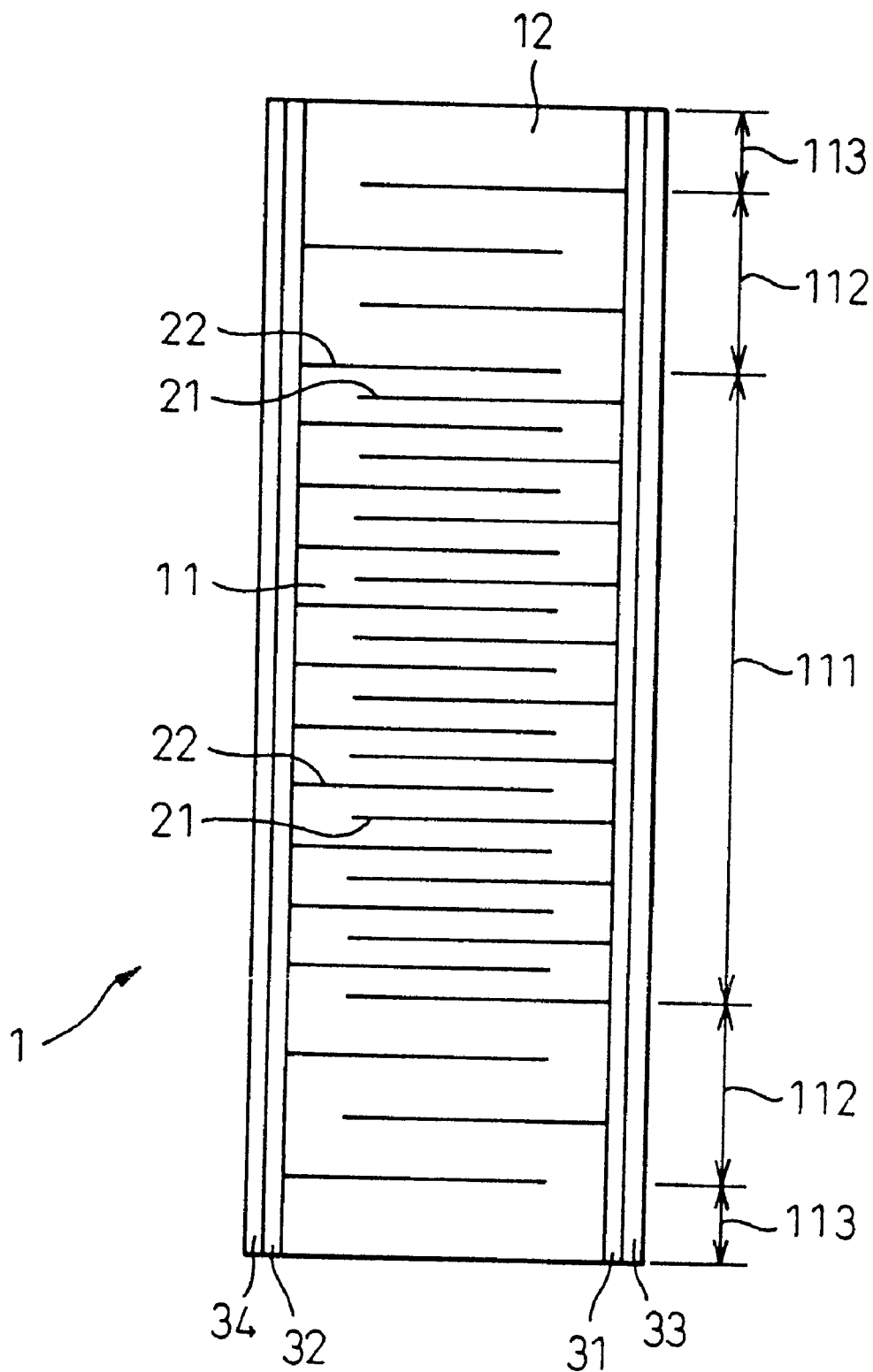

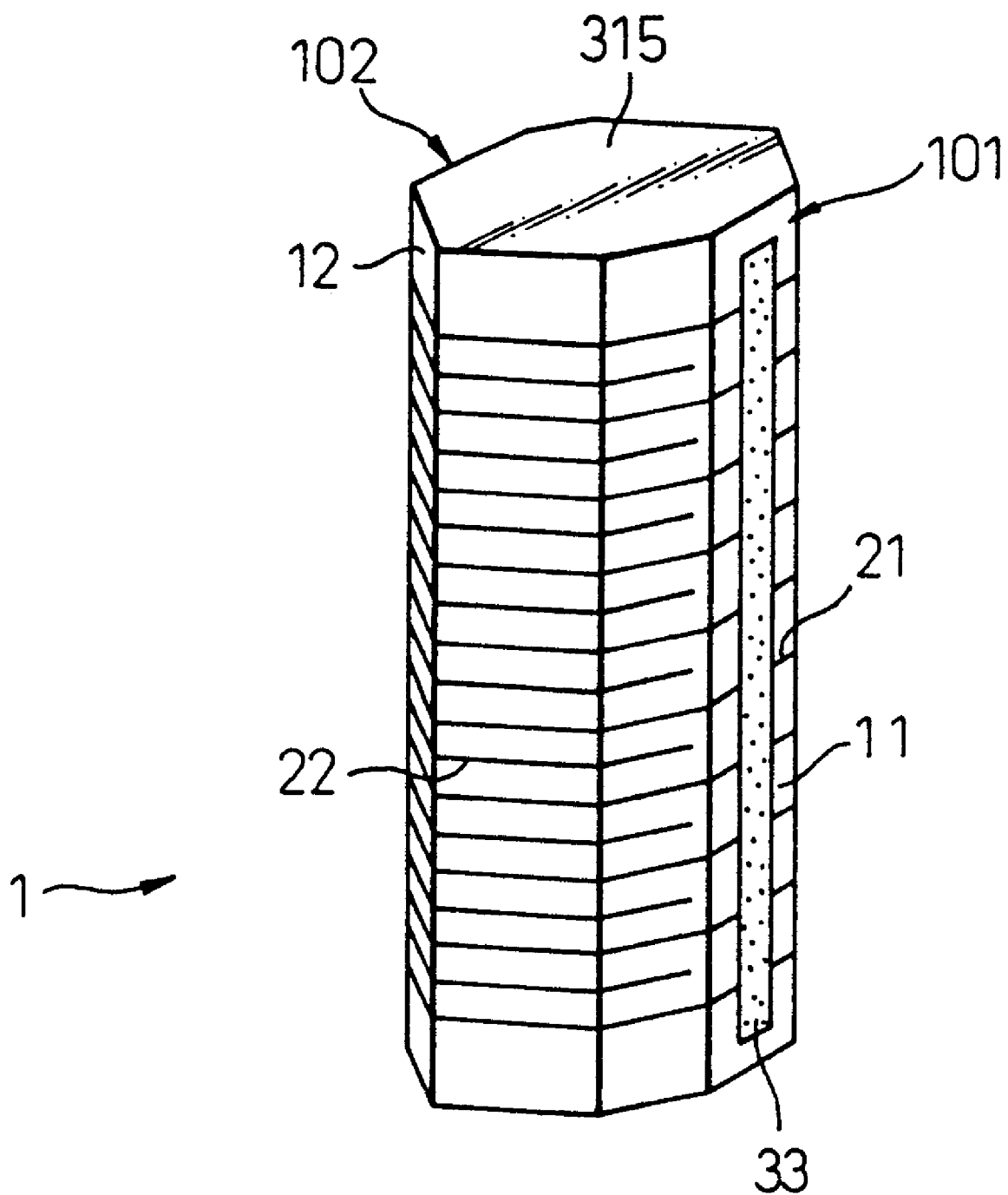

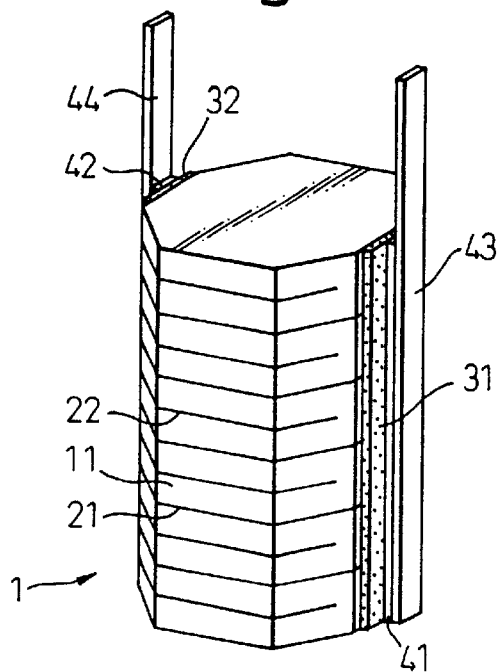
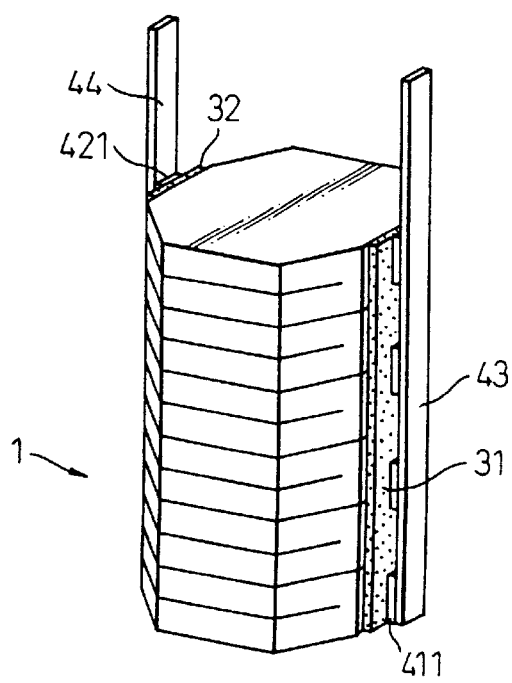

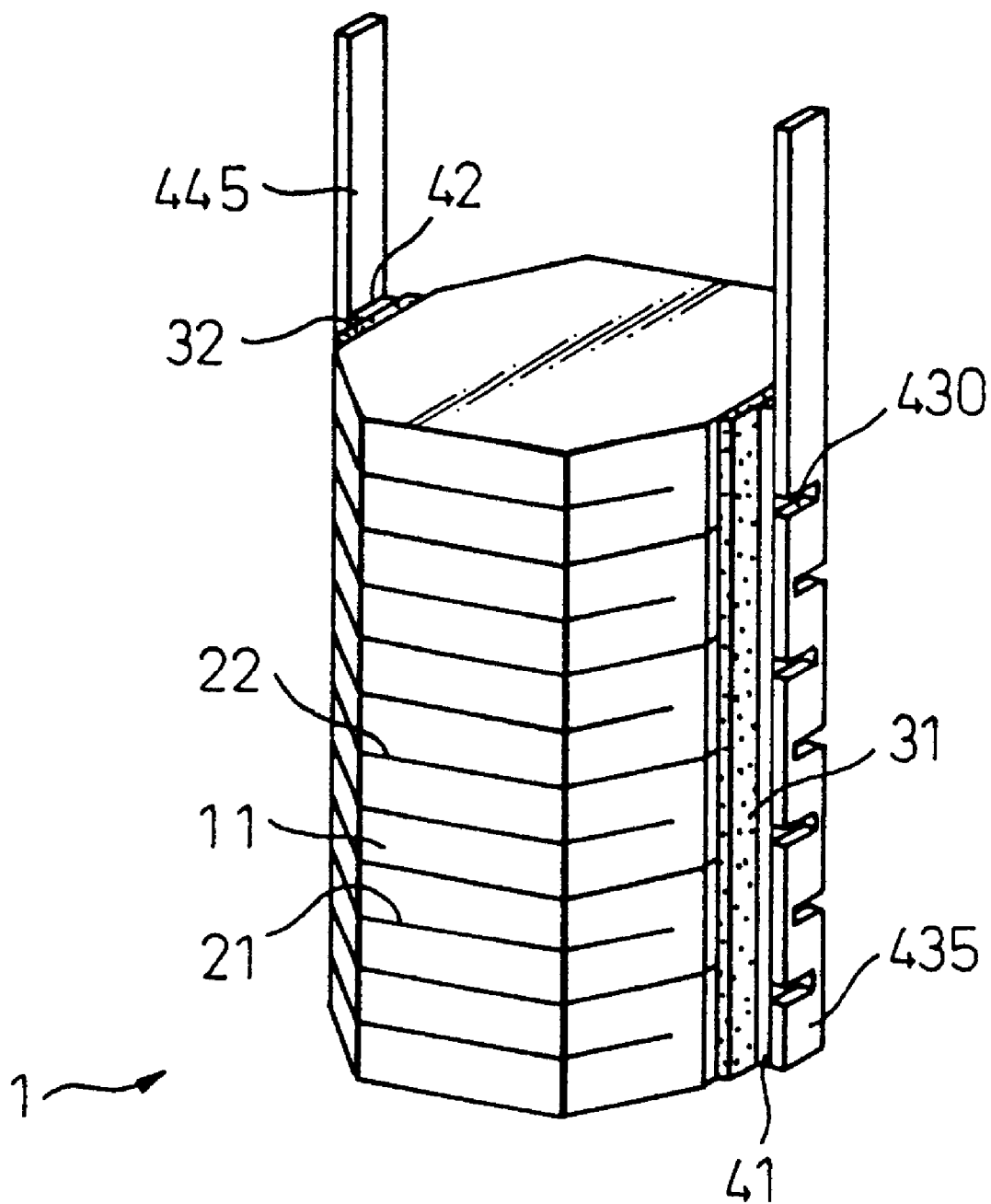

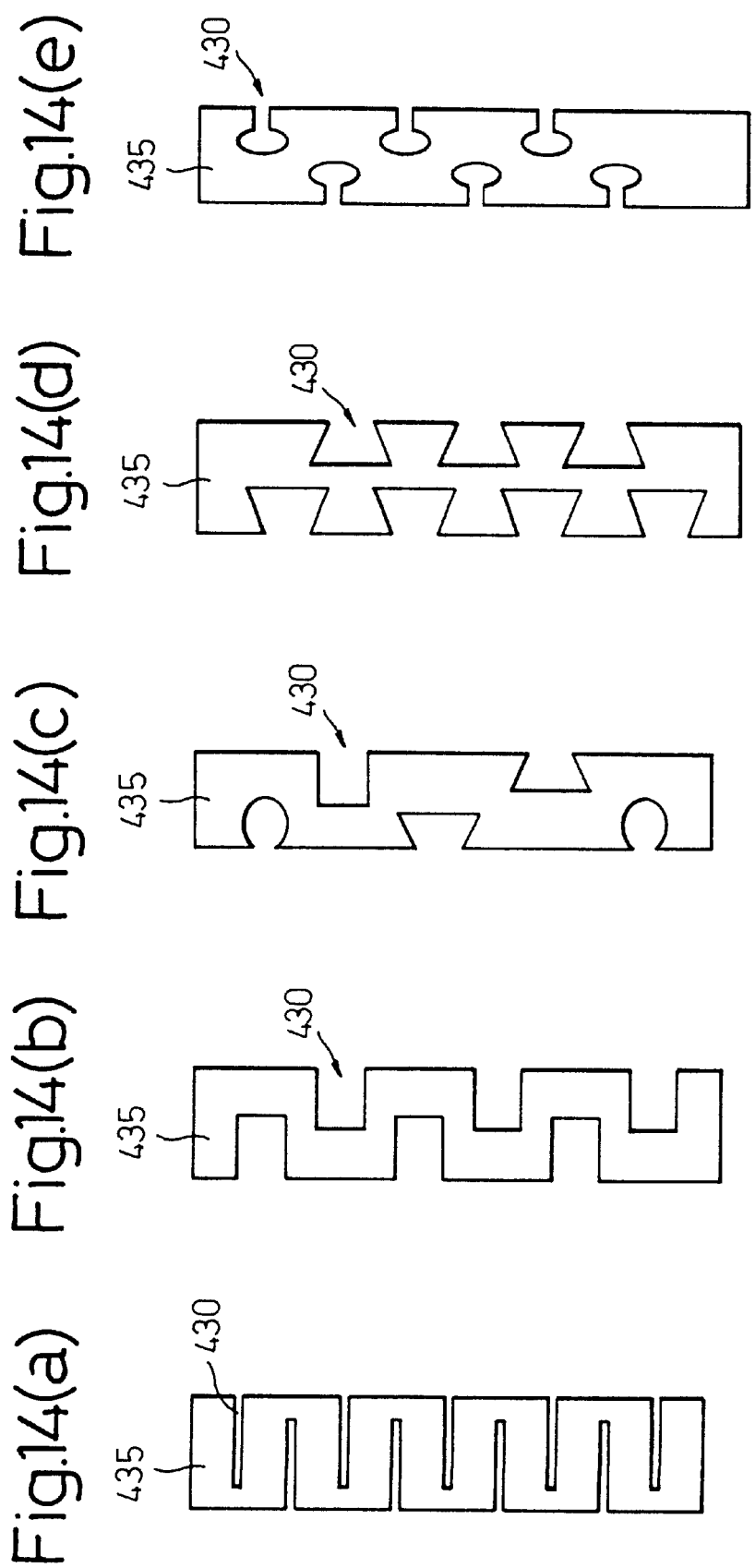

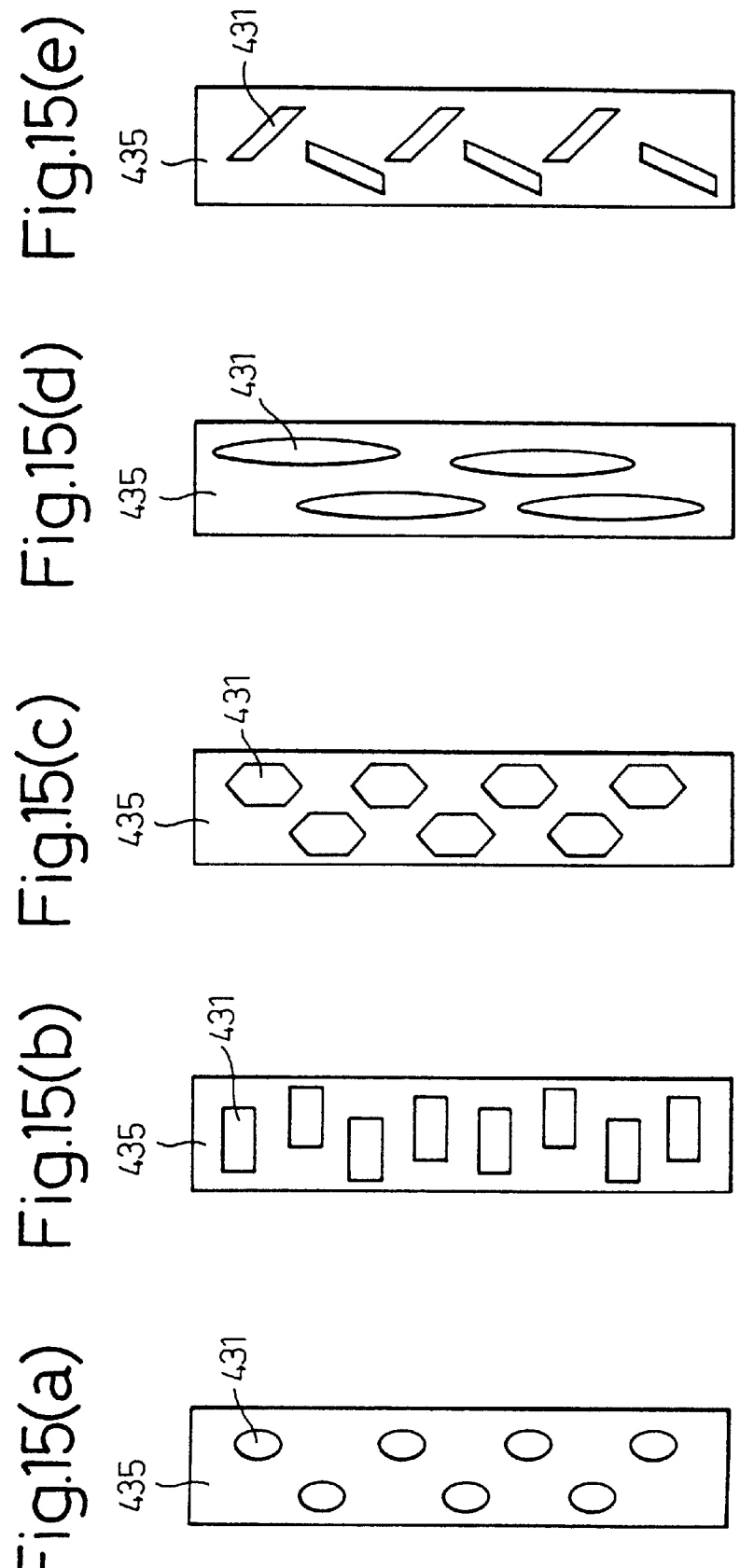

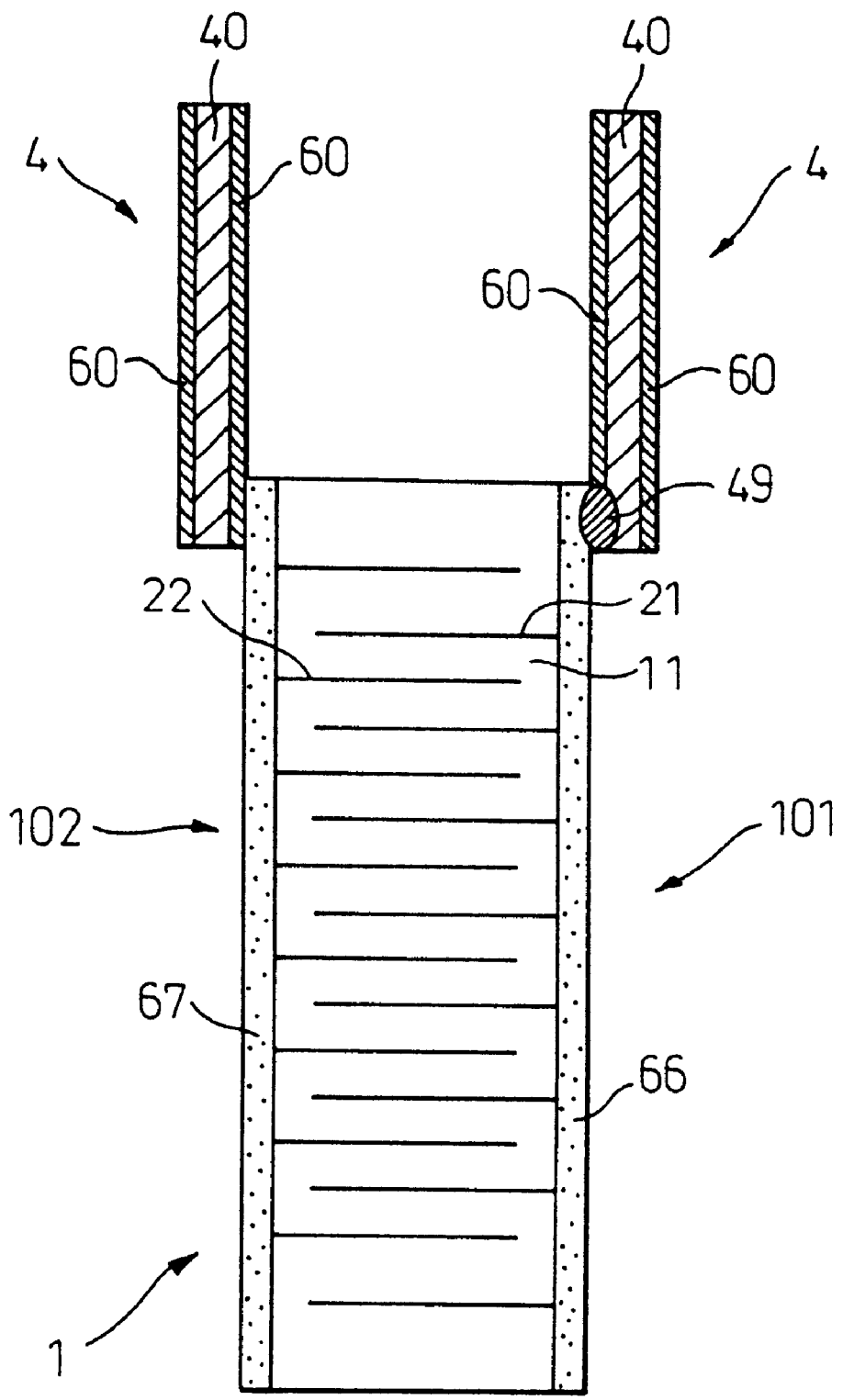

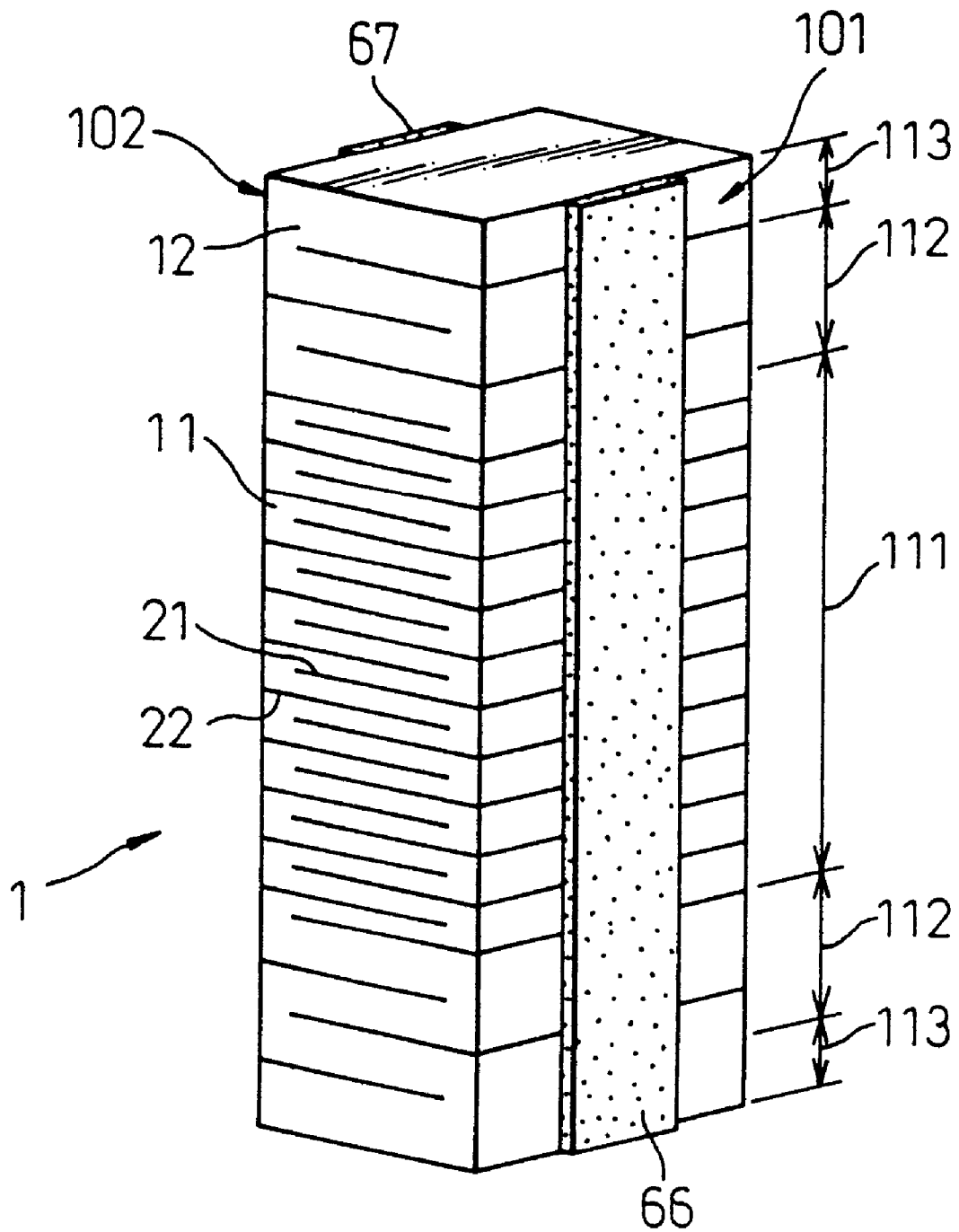

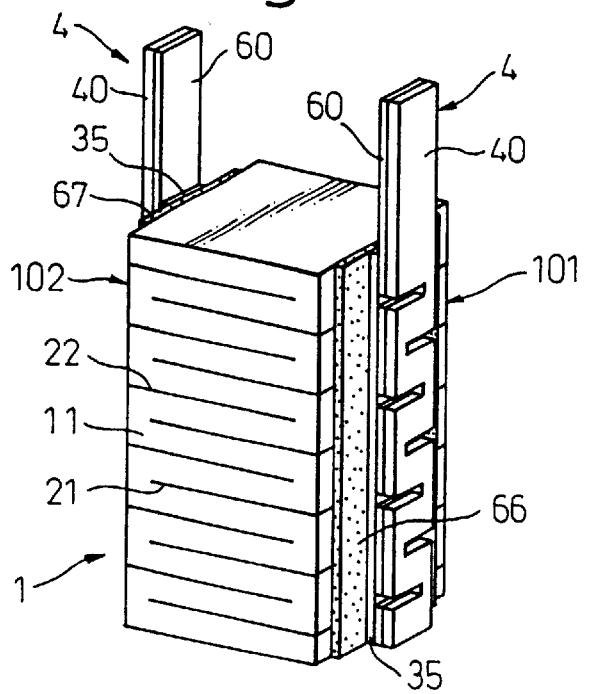
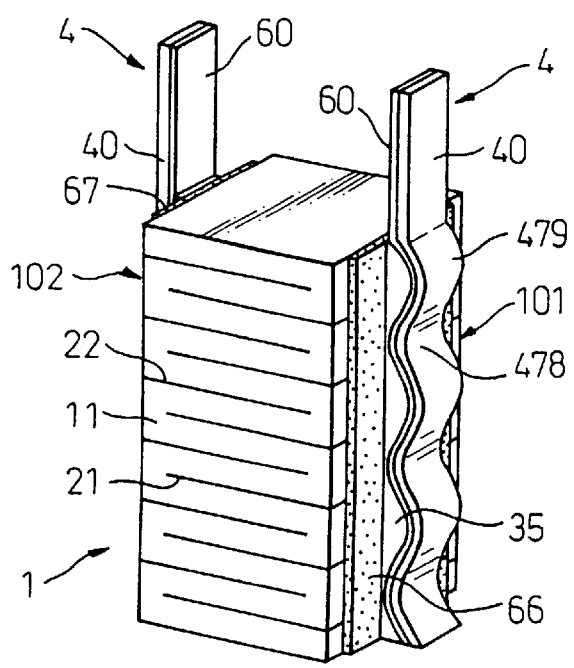

PIEZOELECTRIC DEVICE FOR INJECTOR

BACKGROUND OF THE INVENTION

1. Field of the Invention

The present invention relates to a stack-type piezoelectric device used as a drive source of an injector.

2. Description of the Related Art

The injector (fuel injector) of the internal combustion engine of an automotive vehicle is configured, for example, in such a manner that, by moving the valve body of a three-way valve or a two-way valve connected to a common rail having stored therein a high-pressure fuel, a fuel path is switched between open and closed states thereby to change the pressure applied to the nozzle needle and, by thus opening the nozzle needle, the fuel is injected.

A solenoid valve or the like is generally used as a drive source for activating the valve body. On the other hand, for the purpose of controlling the fuel injection accurately by controlling the drive source in finely detailed fashion, and as disclosed in Japanese Unexamined Patent Publication (Kokai) No. 11-229993, for example, an attempt has been made to use a stack-type piezoelectric device as a drive source for the injector.

Nevertheless, an injector using the piezoelectric device as a drive source, though proposed as described above, has yet to be practically implemented.

Depending on the type of the injector, fuel must be injected under a pressure as high as more than 100 MPa. Thus, the piezoelectric device for the injector is required to have high reliability in a harsh operating environment.

Further, the piezoelectric device for the injector which opens/closes the valve at high speed requires a very quick response. The piezoelectric device for the injector charges and discharge in a short time, and a large current flows therein. With the conventionally known piezoelectric device, therefore, the energy consumption is so large that a large burden is imposed on the control circuit and the circuit configuration becomes undesirably bulky.

A typical configuration of the piezoelectric device for the injector is described below.

Specifically, the piezoelectric device for the injector comprises a plurality of piezoelectric layers which expand or contract in accordance with the applied voltage and a plurality of internal electrode layers for supplying the applied voltage, the piezoelectric layers and the inner electrode layers being stacked alternately with each other, and a pair of side electrode layers formed on the outer peripheral sides, respectively, of the piezoelectric device for the injector which are alternately electrically energized in such a manner that adjacent ones, with a piezoelectric layer therebetween, of the internal electrode layers alternately assume different polarities, wherein a pair of the outer electrode layers each include a terminal for supplying the applied voltage from an external power supply.

In a harsh operating environment, the outer electrode layers are liable to a crack or become disconnected, and it becomes impossible to supply the applied voltage to the internal electrode layers, with the result that the performance and the function, of the piezoelectric device for the injector, are liable to be adversely affected.

Japanese Unexamined Patent No. 10-229227 proposes, in addition to a single outer electrode layer, a three-dimensional structure of electrodes formed through partial contact points of the single outer electrode layer.

With this configuration, even in the case that the outer electrode layer develops a crack or is disconnected, the three-dimensionally structured electrodes can secure the electric conduction of the outer electrode layer.

In view of the very harsh operating environment of the injector, however, the partial contact points are liable to become disconnected and also have an insufficient practical durability.

Further, in the case where a plurality of cracks develop in the outer electrode layer between adjacent partial contact points, current fails to flow between the cracks, resulting in an electrical disconnection.

On the other hand, Japanese unexamined Patent Publication No. 59-204288 proposes a piezoelectric device of a different configuration.

In this piezoelectric device, a material like a conductive rubber is continuously coated on the side thereof, and the piezoelectric device has a configuration including a plurality of piezoelectric short plates each 0.5 mm thick stacked one on another. The inner layer electrode extends to the side surfaces of the short plates.

With the piezoelectric device described above, however, the piezoelectric layer has a thickness of only about 100 $\mu$m and therefore it is difficult to extend the inner layer electrode to the side surfaces thereof. Thus, it is difficult to positively secure the electrical connection between the first outer electrode and the inner layer electrode with a conductive rubber-like material and an ordinary method of baking metal is required.

SUMMARY OF THE INVENTION

The present invention has been achieved in view of the problems in the prior art described above, and an object thereof is to provide a piezoelectric device most suitably used as a drive source for the injector in a harsh environment or, in particular, to a piezoelectric device for the injector which consumes less energy and has a faster response.

According to a first aspect of the invention, there is provided a piezoelectric device, built in an injector for generating the driving force for the injector, comprising:

a plurality of piezoelectric layers adapted to expand or contract in accordance with an applied voltage and a plurality of inner electrode layers for supplying the applied voltage, the piezoelectric layers and the inner electrode layers being stacked alternately with each other;

a pair of first outer electrode layers formed on the outer peripheral sides, respectively, of the piezoelectric device for the injector, which outer electrode layers are adapted to be alternately electrically energized so that adjacent ones of the inner electrode layers, with a piezoelectric layer therebetween, assume different polarities; and second outer electrode layers are formed on the first outer electrode layers, respectively, and are made of a conductive material having a larger breaking elongation than the first outer electrode layers.

One aspect of the invention is that a second outer electrode layer made of a conductive material having a larger breaking elongation than a first outer electrode layer is formed on each of a pair of the first outer electrode layers.

The operation of this aspect of the invention will be explained below.

Each of the second side electrode layers has so large a breaking elongation that it is not easily cracked or disconnected even in a harsh operating environment. The cracking or disconnection of the electrode layer is caused by the expansion of the piezoelectric device which generates the stress in the piezoelectric device for the injector or the electrode layers.

In the configuration according to this aspect of the invention, even in the case where the first outer electrode layers are cracked and disconnected, the electrical conduction between the first outer electrode layers and the inner electrode layers is secured through the second outer electrode layers which have a large breaking elongation and are not easily cracked or disconnected. As a result, a piezoelectric device for the injector can be produced which is usable even in a harsh operating environment.

Also, the reliability can be improved by providing substantially two outer electrode layers including a first outer electrode layer and a second outer electrode layer. With the first outer electrode alone, a slight cracking or disconnection would grossly deteriorate the reliability of the piezoelectric device for the injector. With the configuration according to this aspect of the invention, however, the provision of two outer electrode layers including the second outer electrode layer permits either the first or second outer electrode layer to apply a voltage to the inner electrode layers.

The breaking elongation is determined by the value based on the dumbbell elongation measuring method for a rubber material specified in JIS K6301.

As described above, according to this aspect of the invention, a piezoelectric device most suitably applicable as a drive source of an injector can be provided.

According to a second aspect of the invention, there is provided a piezoelectric device, for an injector in which the second outer electrode layers are preferably configured of a conductive material having a breaking elongation of 1.5% or higher.

This produces a piezoelectric device for the injector having a superior durability capable of enduring protracted operation.

A breaking elongation of less than 1.5% would generate a cracking due to the fatigue derived from the drive operation.

According to a third aspect of the invention, there is provided a piezoelectric device, for an injector, in which the second outer electrode layers are preferably configured of a mixture of a metal material and a resin material.

As a result, second outer electrode layers having a large breaking elongation can be produced.

The stress imposed on the second outer electrode layers by the expansion/contraction of the piezoelectric device for the injector can thus be relaxed and a cracking rarely occurs.

According to a fourth aspect of the invention, there is provided a piezoelectric device, for an injector, in which the resin material of the mixture is preferably at least selected one of silicone, epoxy, polyimide and vinyl phenol.

The mixture of any of these substances can produce the second outer electrode layers having a superior heat resistance and a large breaking elongation. The temperature of the operating environment of the injector used with the automotive internal combustion engine is as high as not lower than 150° C. The aforementioned piezoelectric device having the second outer electrode layers containing the resin material can reduce the stress on the second outer electrode layers generated by the expansion of the piezoelectric device, and the layers rarely develop cracks due to a superior heat resistance.

According to a fifth aspect of the invention, there is provided a piezoelectric device, for an injector, in which the first or second outer electrode layers preferably are composed of a metal material containing Ag.

Silver has a high melting point and a high electric conductivity and therefore rarely poses a problem of conduction failure. Thus, the conductivity between the first and second outer electrode layers can be secured in a high temperature environment. Especially in the case where the first outer electrode layers contains Ag, the conductivity can be secured between the first outer electrode layers and the inner electrode layers in a high temperature environment.

According to a sixth aspect of the invention, there is provided a piezoelectric device, built in an injector and for generating a drive force for the injector, comprising:

a plurality of piezoelectric layers adapted to expand or contract according to the applied voltage and a plurality of inner electrode layers for supplying the applied voltage, the piezoelectric layers and the inner electrode layers being stacked alternately; and a pair of first side electrode layers formed on the outer peripheral side surface of the piezoelectric device for the injector and adapted to be alternately electrically energized so that adjacent ones of the inner electrode layers, with a piezoelectric layer therebetween, may have different polarities;

wherein the first outer electrode layers are coupled to metal members, respectively, through the electrically conductive second outer electrode layers having a larger breaking elongation than the first outer electrode layers.

The functions of this aspect of the invention will be explained below.

Since the second outer electrode layers have a large breaking elongation, cracks or disconnections are not easily generated even in a harsh operating environment.

With the configuration according to this aspect of the invention, even in the case where the first outer electrode layers develop cracks or are disconnected, the metal members arranged through the second outer electrode layers are not easily cracked or disconnected and can secure the electric conductance between the first outer electrode layers and the inner electrode layers. As a result, a piezoelectric device for the injection usable even in a harsh operating environment can be produced.

As described above, according to this invention, a piezoelectric device most suitable as a drive source for the injector can be provided.

The metal members and the first outer electrode layers may be bonded wholly to each other by the second outer electrode layers. Also, the space between the metal members and the first outer electrode layers may be filled with the second outer electrode layers.

According to a seventh aspect of the invention, there is provided a piezoelectric device, for an injector, in which the second outer electrode layers are preferably formed of a conductive material having a breaking elongation of not less than 1.5%.

As a result, a piezoelectric device, for an injector, which can stand protracted operation and has a high durability can be produced. If the breaking elongation is less than 1.5%, cracks may be generated by fatigue due to the drive operation.

According to an eighth aspect of the invention, there is provided a piezoelectric device for the injector, in which the second outer electrode layers are preferably configured of a mixture containing a metal material and a resin material.

This can produce a coupling member having a large breaking elongation.

As a result, the stress imposed on the coupling member by the expansion of the piezoelectric device for the injector is reduced, thereby making it difficult for cracks to develop.

According to a ninth aspect of the invention, there is provided a piezoelectric device, for an injector, in which the resin material of the mixture is preferably at least a selected one of silicone, epoxy, polyimide and vinyl phenol.

The use of any of these substances can produce second outer electrode layers having a superior heat resistance and a large breaking elongation. The temperature of the operating environment of the injector used with the automotive internal combustion engine is as high as not lower than 150° C. The aforementioned piezoelectric device having the second outer electrode layers containing the resin material can reduce the stress on the second outer electrode layers generated by the expansion of the piezoelectric device, and rarely develops cracks due to a superior heat resistance. The other detailed points are similar to those of the fourth aspect of the invention.

According to a tenth aspect of the invention, there is provided a piezoelectric device, for an injector, in which the first or second outer electrode layers preferably are composed of a metal material containing Ag.

Silver has a high melting point and a high electric conductivity and therefore rarely poses a problem of conduction failure. Thus, the conductivity between the first and second outer electrode layers can be secured in a high temperature environment. Especially in the case where the first outer electrode layers contain Ag, the conductivity can be secured between the first outer electrode layers and the inner electrode layers in a high temperature environment.

According to an eleventh aspect of the invention, there is provided a piezoelectric device, built in an injector, for generating a drive force for the injector, in which the metal members are each preferably formed of a metal plate having a corrugated section.

According to a twelfth aspect of the invention, there is provided a piezoelectric device, built in an injector, for generating a drive force for the injector, in which the metal members are each preferably formed of an elastic member such as a spring member.

According to a thirteenth aspect of the invention, there is provided a piezoelectric device, built in an injector, for generating a drive force for the injector, in which the metal members are each preferably formed of a metal plate having slits or holes.

This configuration can provide the metal members with an elasticity. With the piezoelectric device for the injector of which the length is changed along the stack height in accordance with the expansion/contraction of the piezoelectric layers, the expansion/contraction of the metal members simultaneous with the piezoelectric device can prevent the cracking of the metal members.

Also, metal members having a plurality of the aforementioned configurations combined may be used. For example, metal members having slits and having a corrugated section can be used with equal effect.

According to a 14th aspect of the invention, there is provided a piezoelectric device, built in an injector, for generating a drive force for the injectors in which the metal members are each preferably formed of stainless steel or copper.

The use of a material having a large elasticity makes it difficult for fatigue failure to occur even when the metal members are extended by the elongation of the piezoelectric device for an injector.

A stainless steel containing, as main components, 18% Cr and 8% Ni can be used. Also, a copper material such as phosphor bronze containing, as main components, 90% Cu, 9% Sn and 0.35% P can be used.

According to a 15th aspect of the invention, there is provided a piezoelectric device, built in an injector, for generating a drive force for the injector, in which the metal members are each preferably embedded in the corresponding second outer electrode layer.

This configuration makes it possible to couple the metal members positively with the first outer electrode layers.

According to a 16th aspect of the invention, there is provided a piezoelectric device, built in an injector, for generating a drive force for the injector, in which each metal plate having a corrugated section preferably has ridge portions protruded outward of the outer peripheral side of the piezoelectric device for the injector and valley portions each located between given each pair of ridge portions, and at least a part of the ridge portions and the valley portions are formed diagonally over the piezoelectric layers and the inner electrode layers constituting the piezoelectric device for the injector.

This configuration permits the metal plates to couple adjacent ones of the piezoelectric layers along the stack height. Thus, the conductivity of each inner electrode layer can be positively secured by the metal members even in the case where the first outer electrode layers develop cracks due to the expansion or contraction of the piezoelectric device for the injector.

According to a 17th aspect of the invention, there is provided a piezoelectric device, built in an injector, for generating a drive force for the injector, in which each slit is preferably formed diagonally over the piezoelectric layers and the inner electrode layers constituting the piezoelectric device for the injector.

The provision of diagonal slits makes it possible for the metal plates to couple adjacent ones of the piezoelectric layers along the stack height. Thus, the conductivity of each inner electrode layer can be positively secured by the metal members even in the case where the first outer electrode layers develop cracks due to the expansion or contraction of the piezoelectric device for the injector.

According to an 18th aspect of the invention, there is provided a piezoelectric device, built in an injector, for generating a drive force for the injector, in which the distortion due to expansion and contraction is preferably not less than 0.05% and the number of drive cycles of the piezoelectric device for the injector is preferably at least $10^9$. The piezoelectric device satisfying this requirement for distortion and the number of drive cycles can provide the performance and the durability required of an injector.

Specifically, the distortion of a piezoelectric device used as a drive source of the injector, due to expansion/contraction thereof, is preferably not less than 0.05%, if the valve body is to be driven.

For application to an internal combustion engine of an automotive vehicle, the piezoelectric device preferably has a number of drive cycles of not less than $10^9$. The number of drive cycles is an index representing the maximum number of expansion/contraction cycles the piezoelectric device can be driven before an abnormality such as shorting occurs. The greater the number of drive cycles, the higher the durability of the piezoelectric device involved. For both the distortion and the number of drive cycles, the larger, the better.

According to a 19th aspect of the invention, there is provided a stack-type piezoelectric device built in an injector, wherein side electrodes are arranged on the two sides of the piezoelectric device, respectively, and an external electrode is arranged on each of the side electrodes for establishing electric conduction with external parts, wherein the external electrodes each includes a core member and a metal cover for covering at least a part of the core member, the external electrode being coupled to a part of the corresponding side electrode, and wherein the specific electric resistance of the core member is not less than $5 \times 10^{-6}$ ($\Omega \cdot cm$), and the specific electric resistance of the metal cover is not more than one half of that of the core member.

Now, the functions and effects of this aspect of the invention will be explained.

According to this aspect of the invention, the external electrode includes the core member and the metal cover, and the specific electric resistance of these parts have the specific values, respectively, described above.

In the case where the specific electric resistance of the core member is less than $5 \times 10^{-6}$ ($\Omega \cdot cm$), a sufficient electric conductivity can be secured without providing the metal cover. In the case where the specific electric resistance of the core member is not less than $5 \times 10^{-6}$ ($\Omega \cdot cm$) as in this aspect of the invention, on the other hand, a sufficient electric conductivity cannot be secured. In such a case, the energy consumption during the conduction of the piezoelectric device is greatly increased.

In view of this, according to this aspect of the invention, each external electrode is so configured that at least a part of the core member is covered by the metal cover as described above, and the specific electric conductance of the metal cover is set to not more than one half of that of the core member. In the case where a core member having a specific electric resistance of $5 \times 10^{-6}$ ($\Omega \cdot cm$) is selected, for example, the specific electric resistance of the metal cover is set to not more than $5 \times 10^{-6}$ ($\Omega \cdot cm$)

As a result, the metal cover supplements the electrical conductivity of the core member, and therefore the electrical conductivity of the external electrode as a whole is remarkably improved. Thus, less energy is consumed by the electrical resistance of the external electrode, thereby making it possible to suppress the energy consumption of the whole piezoelectric device. In addition, the burden on the control circuit for controlling the piezoelectric device is reduced to allow a smaller circuit configuration.

In this way, according to this aspect of the invention, a piezoelectric device for the injector is provided which consumes less energy and is capable of a fast response.

According to a 20th aspect of the invention, there is provided a piezoelectric device, built in an injector, for generating a drive force for the injector, in which the core member is preferably a metal material having a tensile strength of not less than 500 MPa. Specifically, the core member is preferably made of a metal material having some degree of elasticity, i.e. a somewhat high elastic limit sufficient to follow the expansion or contraction of the piezoelectric device. In the case where the tensile strength is less than 500 MPa, the durability is liable to decrease in following the expansion or contraction of the piezoelectric device.

According to a 21st aspect of the invention, there is provided a piezoelectric device, built in an injector, for generating a drive force for the injector, in which the core member is preferably made of selected one of SUS, copper beryllium, phosphor bronze and nickel silver. In this case, the core member can have a sufficient elasticity, thereby making it possible to improve the durability of the external electrode as a whole.

According to a 22nd aspect of the invention, there is provided a piezoelectric device, built in an injector, for generating a drive force for the injector, in which the metal cover is preferably made of selected one of silver, gold and copper. In this case, the specific electric resistance of the metal cover can be greatly reduced, thereby making it possible to further improve the electrical conductivity of the external electrode as a whole.

According to a 23rd aspect of the invention, there is provided a piezoelectric device built in the injector for generating a drive force for the injector, in which the metal cover is preferably arranged in such a manner as to cover at least 30% of the surface area of the core member. In the case where the area covered by the metal cover is less than 30% of the surface area of the core member, a problem is posed in that the electric resistance of the whole external electrode cannot be reduced sufficiently.

According to a 24th aspect of the invention, there is provided a piezoelectric device, built in an injector, for generating a drive force for the injector, in which a substrate material for reducing the distance between the core member and the metal cover is preferably interposed between the core member and the metal cover. By doing so, the core member and the metal cover can be attached to each other more closely. The substrate material may be Ni plating, for example.

According to a 25th aspect of the invention, there is provided a piezoelectric device, built in an injector for generating a drive force for the injector, in which the outer electrodes are made of a conductive adhesive containing silver, and the metal cover is arranged on at least the joint surface between the external electrode and the conductive adhesive.

According to a 26th aspect of the invention, there is provided a piezoelectric device, built in an injector, for generating a drive force for the injector, in which each of the outer electrodes and the corresponding external electrodes are coupled to each other by a conductive adhesive containing silver, and the metal cover is arranged on at least the joint surfaces between the external electrodes and the conductive adhesive.

In any of these cases, an increase in electrical resistance (interface resistance) due to age degradation can be suppressed in the boundary surface between the external electrode and the conductive adhesive.

BRIEF DESCRIPTION OF THE DRAWINGS

FIG. 1 is a sectional view to explain a piezoelectric device for the injector having first and second outer electrode layers on the outer peripheral sides thereof according to a first embodiment of the invention.

FIG. 2 is a perspective view of a piezoelectric device for the injector according to the first embodiment of the invention.

FIG. 9 is a perspective view of a piezoelectric device, for an injector, having metal members each arranged on the corresponding one of first outer electrode layers through the corresponding one of second outer electrode layers according to a third embodiment of the invention.

FIG. 10 is a perspective view of a piezoelectric device for the injector having metal members partially arranged on each of the first outer electrode layers through the corresponding one of the second outer electrode layers according to the third embodiment of the invention.

FIG. 13 is a perspective view of a piezoelectric device for the injector having metal members each having slits arranged on the corresponding one of first outer electrode layer through the corresponding one of second outer electrode layers according to a fifth embodiment of the invention.

FIGS. 14(a), 14(b), 14(c), 14(d) and 14(e) are diagrams for explaining the various shapes of the metal member having slits according to the fifth embodiment of the invention.

FIGS. 15(a), 15(b), 15(c), 15(d) and 15(e) are diagrams for explaining the various shapes of the metal member having holes according to the fifth embodiment of the invention.

FIG. 23 is a sectional view to explain the configuration of a piezoelectric device according to a tenth embodiment of the invention.

FIG. 24 is a perspective view showing a stack-type of piezoelectric device according to the tenth embodiment of the invention.

FIG. 32 is a perspective view of a piezoelectric device according to a 15th embodiment of the invention.

FIG. 33 is a perspective view of a piezoelectric device according to a 16th embodiment of the invention.

Figure 3A:
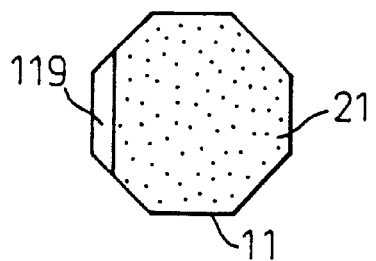
FIGS. 3(*a*) and 3(*b*) are plan views of a piezoelectric layer and an inner electrode layer, and FIG. 3(*c*) a perspective developing showing a stack of the piezoelectric layers and the inner electrode layers, according to the first embodiment.

DESCRIPTION OF THE PREFERRED EMBODIMENTS (First Embodiment)

A piezoelectric device, for an injector, according to an embodiment of the invention will be explained with reference to FIGS. 1 to 4.

As shown in FIGS. 1 to 4, according to this embodiment, there is provided a piezoelectric device 1 built in an injector 5 to generate a driving force of the injector 5. The piezoelectric device 1 for the injector 5 comprises a plurality of piezoelectric layers 11 adapted to expand in accordance with the applied voltage and a plurality of inner electrode layers 21, 22 for supplying the applied voltage, which layers 11 and 21, 22 are alternately arranged.

A pair of first outer electrode layers 31, 32 are alternately electrically energized and are arranged on the outer peripheral side surfaces 101, 102 of the piezoelectric device 1 for the injector. Thus, each pair of the inner electrode layers 21, 22 adjacently formed with the piezoelectric layer 11 therebetween assume opposite polarities.

On the other hand, second outer electrode layers 33, 34 configured of a conductive material having a larger breaking elongation than the first outer electrode layers 31, 32 are arranged on the first outer electrode layers 31, 32.

A detailed description will be given below.

In the piezoelectric device 1 for the injector, as shown in FIGS. 1 and 2, the inner electrode layers 21, 22 are formed to assume positive and negative values alternately between the piezoelectric layers 11. As shown in FIGS. 1 and 2, the inner electrode layers 21 are arranged in such a manner as to be exposed to the outer peripheral side surface 101, while the other inner electrode layers 22 are arranged in such a manner as to be exposed to the other outer peripheral side surface 102. The outer peripheral side surfaces 101, 102 of the piezoelectric device 1 for the injector are formed with the first outer electrode layers 31, 32 of sintered silver so as to connect the exposed ends of the inner electrode layers 21, 22.

Each piezoelectric layer 11 is formed in the shape of an octagon.

The second outer electrode layers 33, 34 made of resin with silver are formed in such a manner as to cover the first outer electrode layers 31, 32.

The sintered silver making up the first outer electrode layers 31, 32, as described later, is composed of Ag (97%) and a glass frit component (3%) produced by curing Ag paste.

The first outer electrodes 31, 32 can alternatively be formed by vacuum evaporation or plating.

On the other hand, the second outer electrode layers 33, 34 made of resin with silver, as described later, are electrodes fabricated by baking a resin with silver paste. The resin with silver is composed of 80% of Ag and 20% of epoxy resin, and has a breaking elongation of 3%.

A selected one of the first outer electrode layers 31, 32 and a selected one of the second outer electrode layers 33, 34 are connected to a terminal for supplying the applied voltage from an external source (not shown). The terminal is connected by brazing, soldering or a fixing band, or by using the material of the second outer electrodes.

In the piezoelectric device 1 for the injector, as shown in FIG. 1, the central portion along the stack height makes up a drive portion 111, the portions arranged to sandwich the drive portion 111 make up buffer portions 112, and the portions arranged to sandwich the buffer portions 112 constitute dummy portions 113.

A method of fabricating, and the detailed structure of, the piezoelectric device 1 for the injector of this configuration will be explained.

The piezoelectric device 1 for the injector according to this embodiment can be fabricated by the widely-used green sheet method. The green sheet is composed of main piezoelectric materials including lead oxide, zirconium oxide, titanium oxide, niobium oxide and strontium oxide in powder form which are weighed into a desired composition by a well-known method. Also, taking the evaporation of lead into consideration, the mixture described above is prepared 1% to 2% richer than the stoichiometric ratio. These components are mixed in dry form in a mixer and calcinated at 800 to 950° C.

The calcinated powder is mixed with pure water and a dispersant to make a slurry, and crushed in wet form by a pearl mill. The crushed material is dried and degreased, after which a solvent, a binder, a plasticizer, a dispersant, etc. are added and mixed in a ball mill. After that, the slurry is agitated and defoamed in a vacuum device while adjusting the viscosity.

As the next step, the slurry is formed into a green sheet of predetermined thickness by a doctor blade device.

The green sheet thus recovered is punched in a press or cut by a cutter and thus formed into a rectangular object of predetermined size. The green sheet is shared by the drive portion, the buffer portion and the dummy portion.

Figure 3B:
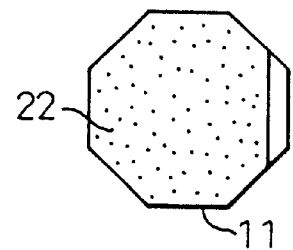

One of the surfaces of the green sheet thus formed is screen-printed with a pattern of the paste of silver and palladium (hereinafter referred to as the Ag/Pd paste) composed of seven parts of sliver and three parts of palladium. FIGS. 3(a) and 3(b) show an example of the green sheet printed with the pattern. By way of explanation, substantially the same portions are designated by the same reference numerals, respectively.

The green sheet 11 making up a piezoelectric layer is formed with a pattern 21 (22) slightly smaller than but over substantially the entire surface by the Ag/Pd paste thereby to form an inner electrode layer 21 (22). One of the opposed sides on the surface of the green sheet 11 is provided with a portion 119 not formed with the inner electrode layer 21 (22). Specifically, the inner electrode layer 21 (22) fails to reach the end portion (the portion corresponding to the side surface 101 or 102 of the piezoelectric device 1 for the injector) of one of the opposed sides of the green sheet 11, while the other end portion opposed thereto reaches the inner electrode layer 21 (22).

A predetermined number of the green sheets 11 formed with the inner electrode layer 21 (22) in this way are prepared to form layers based on the specification requirement of the displacement of the drive portion 111 and the buffer portions 112. Also, the required number of the green sheets 12 not printed with the inner electrode layer for the buffer portions 112 and the dummy portions 113 are also prepared.

Figure 3C:
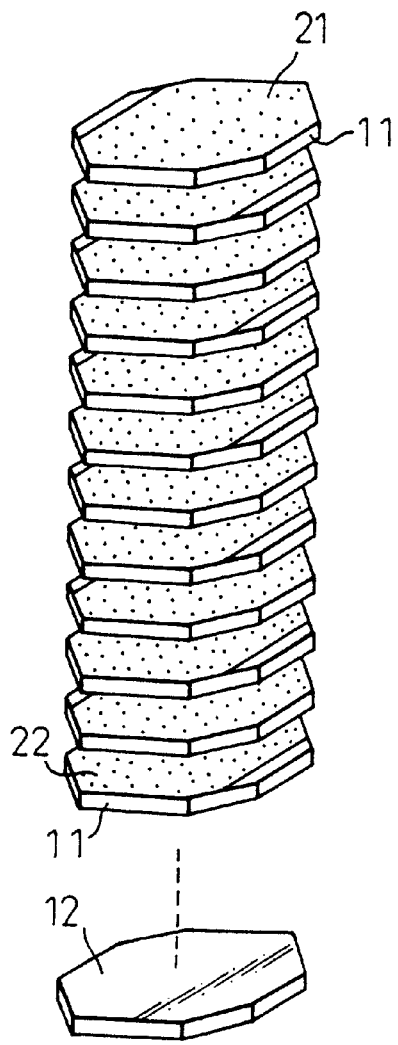

Then, the green sheets 11 and 12 are stacked. FIG. 3c shows a stack of the green sheets 11 and 12 and substantially illustrates an exploded view of the piezoelectric device 1 for the injector. This diagram mainly shows the portion involving the drive portion.

In the case where the green sheets 11 formed with the inner electrode layer 21 (22) are stacked, they are stacked in such a manner that the portion 119 not formed with the electrode is alternated between the left and right sides in the drawing. As a result, the inner electrode layer 21 exposed by reaching the right side surface 101 of the green sheet 11 makes up the inner electrode of one polarity, while the inner electrode layer 22 exposed by reaching the left side surface 102 makes up the inner electrode layer of the other polarity.

In the central drive portion 111, as shown in FIG. 3(c), only the green sheets 11 formed with the inner electrode layer 21 (22) are stacked. In the buffer portions 112, on the other hand, the green sheets 11 are stacked while interposing the green sheets 12 not formed with the inner electrode layer between the green sheets 11. In the dummy portions 113, only the green sheets 12 not formed with the inner electrode layer are stacked.

As a result, a stack structure having the configuration shown in FIG. 1. is formed.

After thermal compression in a hot water rubber press or the like, the assembly is degreased in the electric furnace at 400 to 700° C. and baked at 900 to 1200° C.

As the next step, the Ag paste is coated on the side surface of the stack structure and cured thereby to form the first outer electrode layers 31, 32. According to this embodiment, instead of forming the first outer electrode layer with sintered silver, the Ag/Pd, Pt, Cu, Ni or Au paste or the like can be used for curing. Also, silver, copper, nickels platinum, gold or the like can be used alternatively as a material of the inner electrode layer.

The first outer electrode layer 31 is formed at positions where the inner electrode layers 21 of one polarity are exposed to establish conduction with each inner electrode layer 21. The first outer electrode layer 32 of the other polarity, on the other hand, is formed at positions where the inner electrode layers 22 of the other polarity are exposed to establish conduction with each inner electrode layer 22.

After that, the first outer electrode layers 31, 32 are coated with a resin with silver paste (formed in such a manner as to secure conduction with all of the inner electrode layers 21, 22 even if cracks develops in the first outer electrode layers 31, 32) which is hardened thereby to form the second outer electrode layers 33, 34 on the first outer electrode layers 31, 32.

The assembly is immersed in an insulating oil and a DC voltage is applied between the inner electrode layers 21, 22 from the first and second outer electrode layers 31 to 34. Thus, the piezoelectric layers 11 are polarized to produce the piezoelectric device 1 for the injector.

The green sheet (piezoelectric layer) 12 of the same material as the piezoelectric layer 11 of the drive portion 111 is used for the dummy portions 113. In this way, the production cost is reduced by preventing an increase in the number of types of the production materials.

Also, the first outer electrode layers 31, 32 on the outer peripheral side surfaces 101, 102 of the piezoelectric device 1 for the injector are each connected with a lead wire as a terminal.

The whole of the outer peripheral side surfaces 101, 102 perpendicular to the stack height of the piezoelectric device 1 for the injector is formed with an insulating coating having a thickness of not less than 0.005 mm (not shown). According to this embodiment, silicone resin is used as the insulating coating.

Now, a brief explanation will be given of an example of the injector in which the piezoelectric device 1 for the injector can be used as a drive source.

Figure 4:
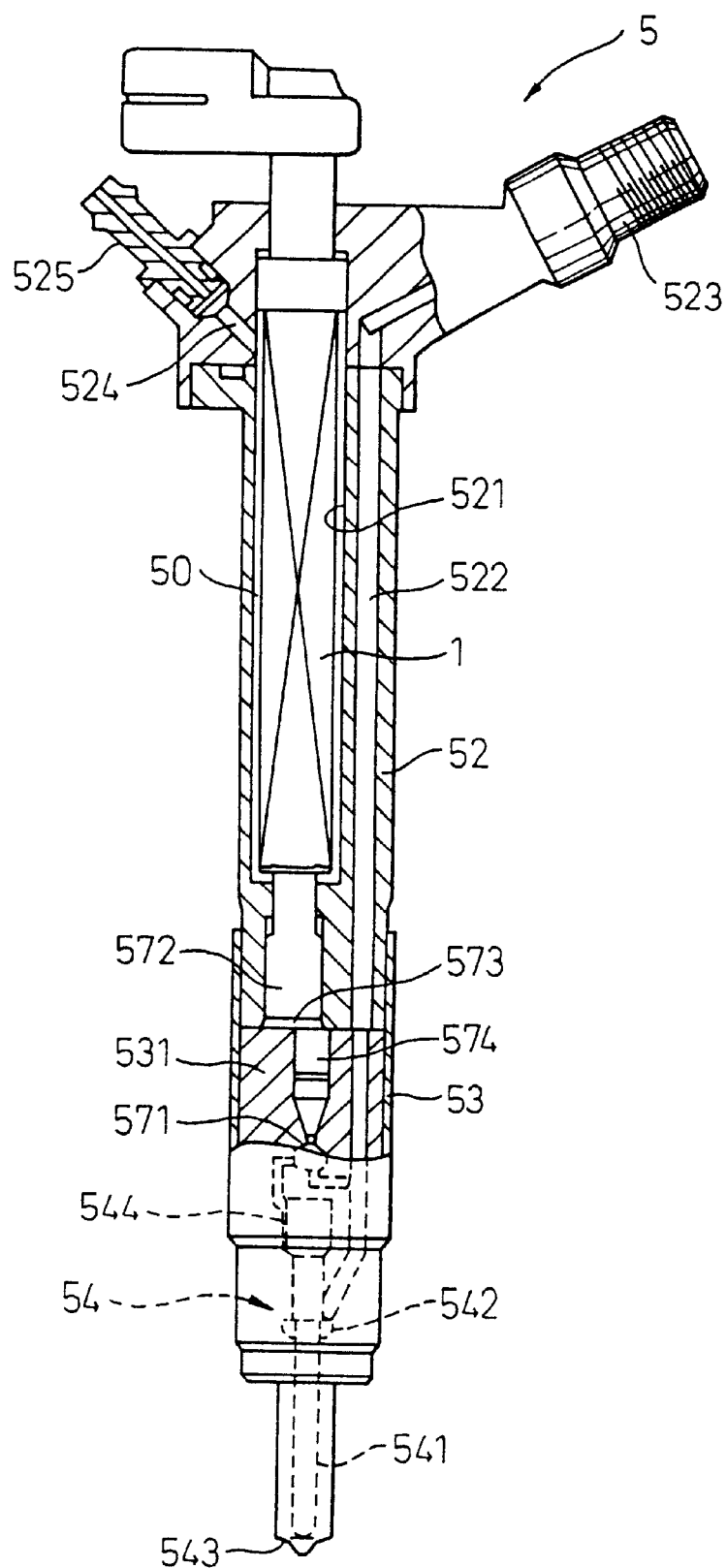
FIG. 4 is a sectional view to explain the injector according to the first embodiment of the invention.

The injector 5, as shown in FIG. 4, is used for the common-rail injection system of the diesel engine.

This injector 5, as shown in FIG. 4, includes an upper housing 52 for accommodating the piezoelectric device 1 making up a drive portion and a lower housing 53 fixed at the lower end of the upper housing 52 and formed with an injection nozzle portion 54 therein.

The upper housing 52 is substantially in the shape solid cylinder and has a vertical hole 521 eccentric about the center axis into which the piezoelectric device 1 is fixedly inserted.

A high pressure fuel path 522 is formed in parallel to the vertical hole 521 sideways thereof, and the upper end portion of the fuel path 522 communicates with an external common rail (not shown) through the interior of a fuel lead pipe 523 projected upward of the upper housing 52.

A fuel lead pipe 525 communicating with a drain path 524 is also projected from the upper side of the upper housing 52, so that the fuel flowing out of the fuel lead pipe 525 is returned to the fuel tank (not shown).

The drain path 524 communicates with a three-way valve 551 described later through a gap 50 between the vertical hole 521 and the drive portion (piezoelectric device) 1 and further by way of a path (not shown) extending downward from the gap 50 in the upper and lower housings 52, 53.

The injection nozzle portion 54 includes a nozzle needle 541 adapted to slide in vertical direction in a piston body 531, and an injection hole 543 opened/closed by the nozzle needle 541 for injecting the high-pressure fuel supplied from a fuel pool 542 to each cylinder of the engine. The fuel pool 542 is formed around the intermediate portion of the nozzle needle 541, and the lower end portion of the high-pressure fuel path 522 is open to the fuel pool 542. The nozzle needle 541 receives the fuel pressure both in the direction of opening the valve from the fuel pool 542 on the one hand and in the direction of closing the valve from a back pressure chamber 544 arranged in opposed relation to the upper end portion on the other hand. Once the pressure in the back pressure chamber 544 is decreased, the nozzle needle 541 is lifted and the injection hole 543 is opened thereby to inject the fuel.

The pressure in the back pressure chamber 544 is increased or decreased by a three-way valve 571. The three-way valve 571 is configured to establish communication between the back pressure chamber 544 and the high pressure fuel path 522 or the drain path 524 selectively. In the case under consideration, the three-way valve 571 has a valve body in the shape of ball adapted to open/close the port communicating with the high-pressure fuel path 522 or the drain path 524. This valve body is driven by the drive portion 1 through a large-diameter piston 572, an oil pressure chamber 573 and a small-diameter piston 574 arranged under the drive portion 1.

One feature of the piezoelectric device 1 for the injector according to this embodiment lies in that the second outer electrode layers 33, 34 made of resin with silver, having a larger breaking elongation than a pair of the first outer electrode layers 31, 32 made of sintered silver, are formed on the first outer electrode layers 31, 32.

The second outer electrode layers 33, 34 have such a large breaking elongation that no cracking or disconnection occurs even in a harsh operating environment.

With the piezoelectric device 1 for the injector according to this embodiment, even in the case where the first outer electrode layers 31, 32 develop cracks or disconnections, electrical conduction can be secured between the first outer electrode layers 31, 32 and the inner electrode layers 21, 22 through the second outer electrode layers 33, 34 which are not easily cracked or disconnected. Thus, a piezoelectric device 1 for the injector is obtained which is usable even in a harsh operating environment.

Also, the provision of two outer electrode layers including the first and second ones improves the reliability.

As described above, according to this embodiment, there is provided a piezoelectric device for the injector most suitable as a drive source of the injector.

Figure 5:
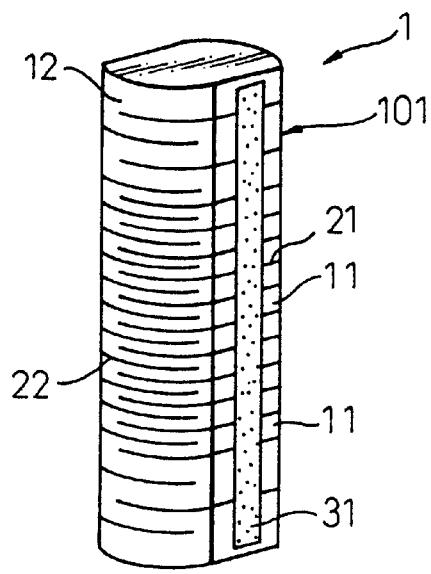
FIG. 5 is a perspective view of a piezoelectric device for the injector configured of barrel-shaped piezoelectric layers according to the first embodiment of the invention.
Figure 6:
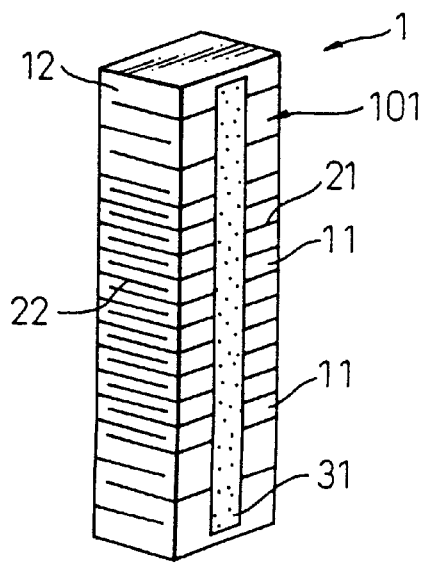
FIG. 6 is a perspective view of a piezoelectric device for the injector configured of rectangular piezoelectric layers according to the first embodiment of the invention.

Also, each of the piezoelectric layers 11 of the piezoelectric device 1 can be in the shape of barrel instead of the octagon, as shown in FIG. 5. A rectangle is another alternative as shown in FIG. 6.

(Second Embodiment)

Figure 8:
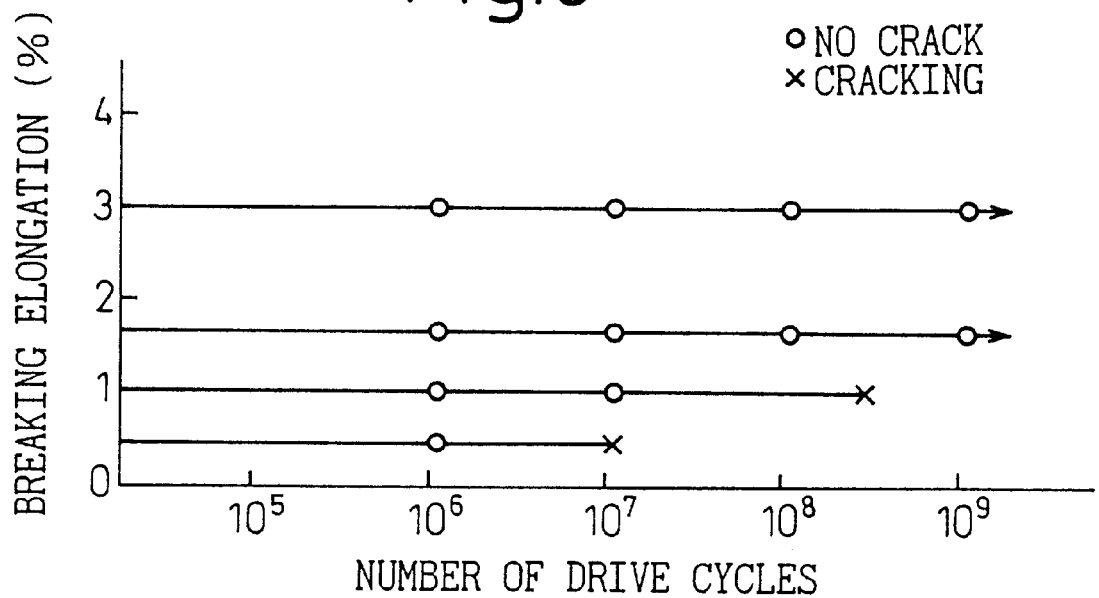
FIG. 8 is a diagram showing the relation between the breaking elongation of the second outer electrode layers and the number of drive cycles according to the second embodiment of the invention.

In this embodiment, as shown in FIG. 8, the relation is determined by measurement between the magnitude of the breaking elongation of the second electrode layers and the number of drive cycles.

Figure 7:
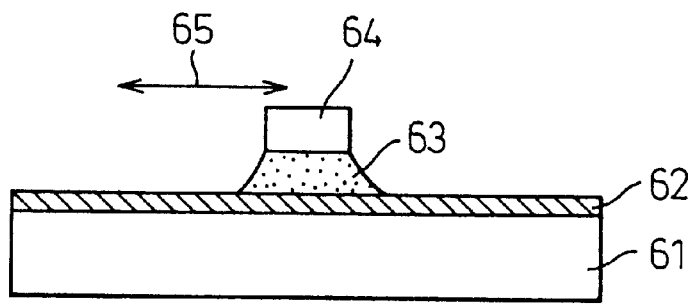
FIG. 7 is a diagram for explaining a testing method for determining the relation between the breaking elongation of the second outer electrode layers and the number of drive cycles according to a second embodiment of the invention.

The measurement according to this embodiment is conducted using samples modeled after the piezoelectric device as shown in FIG. 7. An electrode layer 62 having the same composition as the first outer electrode layers is formed on a piezoelectric plate 61 having the same composition as the piezoelectric layers 11 according to the first embodiment, and an electrode layer 63 having the same composition as the second outer electrode layers is formed on the electrode layer 62. A stainless steel plate 64 plated with silver is formed on the surface of the electrode layer 63.

Four samples having different breaking elongations of the electrode layer 62 are prepared.

The stainless steel plate 64 is driven in the directions of arrow 65 at the frequency of 250 Hz in the same manner that the piezoelectric device in the first embodiment is driven. In this way, stress is imposed on the electrode layer 63 in similar fashion to the case in which the piezoelectric device 1 is driven. The number of drive cycles performed by this driving operation before a crack is generated in the electrode layer 63 is counted and the measurement is obtained as shown in FIG. 8.

As seen from FIG. 8, a crack is generated when the number of drive cycles is about $10^7$ in the case where the breaking elongation is less than 1%. No cracking occurs even when the number of drive cycles is $10^9$ or more for the breaking elongation of more than 1.5%.

In this way, it has been found that a piezoelectric device that can withstand a large number of drive cycles can be obtained when the breaking elongation is more than 1.5%.

(Third Embodiment)

This embodiment, as shown in FIG. 9, refers to a piezoelectric device 1 for the injector so configured that metal members 43, 44 are coupled to the first outer electrode layers 31, 32 through conductive second outer electrode layers 41, 42 having a higher flexibility than the first outer electrode layers 31, 32.

In the piezoelectric device 1 for the injector according to this embodiment, as shown in FIG. 9, the inner electrode layers 21, 22 are arranged between the piezoelectric layers 11 to have positive and negative polarities alternately on the left and right sides. As shown in FIG. 9, the inner electrode layers 21 are arranged in such a manner as to be exposed to the outer peripheral side surface 101, while the inner electrode layers 22 are arranged in such a manner as to be exposed to the other outer peripheral side surface 102. The outer peripheral side surfaces 101, 102 of the piezoelectric device 1 for the injector are formed with the first outer electrode layers 31, 32 of sintered silver to assure conduction of the exposed ends of the inner electrode layers 21, 22.

The second outer electrode layers 41, 42 of resin with silver are formed in such a manner as to cover the first outer electrode layers 31, 32, on which the tabular metal members 43, 44 are formed.

The metal members 43, 44 double as voltage application terminals by way of which a voltage is applied to the inner electrode layers 21, 22 from an external power supply not shown through the second outer electrodes 41, 42 and the first outer electrodes 31, 32.

As an alternative, terminals of a material different from the metal members 43, 44 may be arranged on the first outer electrode layers 31, 32, or the first outer electrode layers 31, 32 may be extended to constitute terminals.

The first outer electrode layers 31, 32 of sintered silver are produced, as in the first embodiment, by curing Ag paste. The resin with silver of the second outer electrode layers 41, 42 also has a similar composition to that used for the first embodiment.

The metal members 43, 44 are formed of a material having a high elasticity such as stainless steel (main components: 18% Cr and 8% Ni, for example) or phosphor bronze (main components: 90% Cu, 9% Sn and 0.35% P).

The other detailed points are similar to the corresponding ones of the first embodiment.

The second side electrode layers 41, 42 have so high a flexibility that they are not easily cracked or disconnected even in a harsh operating environment.

Even in the case where the first outer electrode layers 31, 32 are cracked or disconnected, therefore, the electrical conduction between substantially all the inner electrode layers 21, 22 can be secured by the metal members 43, 44 arranged through the second outer electrode layers 41, 42 which cannot be easily cracked or disconnected. Thus, the piezoelectric device 1 for the injector can secure a sufficient elongation to operate the injector valve.

As a result, the piezoelectric device 1 for the injector, usable even in a harsh operating environment, can be produced.

According to this embodiment, there is thus provided a piezoelectric device for the injector most suitable as a drive source for the injector.

As shown in FIG. 10, the metal members 43, 44 may alternatively be formed on the first outer electrode layers 31, 32 by use of the second outer electrode layers 411, 421 formed partially on the metal members 43, 44. In other words, the second outer electrode layers 411, 421 are arranged partially along the stack height of the piezoelectric layers 11.

In this case, the generation of a cracking can be suppressed by relaxing the stress imposed on the second outer electrode layers 41, 42 by the expansion/contraction of the piezoelectric device 1 for the injector.

(Fourth Embodiment)

Figure 11:
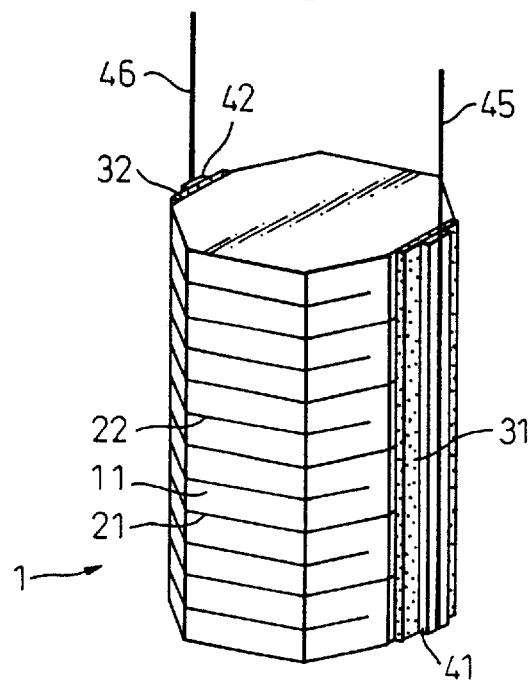
FIG. 11 is a perspective view of a piezoelectric device for the injector having wire metal members each arranged on the corresponding one of first outer electrode layers through the corresponding one of second outer electrode layers according to a fourth embodiment of the invention.

This embodiment refers to the piezoelectric device 1 for the injector using wires as metal members 45, 46, as shown in FIG. 11.

As shown in FIG. 11, the piezoelectric device 1 for the injector according to this embodiment has a similar configuration to the third embodiment. The difference of this embodiment is that the metal members 45, 46 are formed of a Cu wire plated with Ag and have a diameter of φ1 mM. The other detailed points are similar to those of the first embodiment.

The use of wires as the metal members 45, 46 as in this embodiment makes possible a two-dimensional structure and can reduce the required space (size).

Figure 12A:
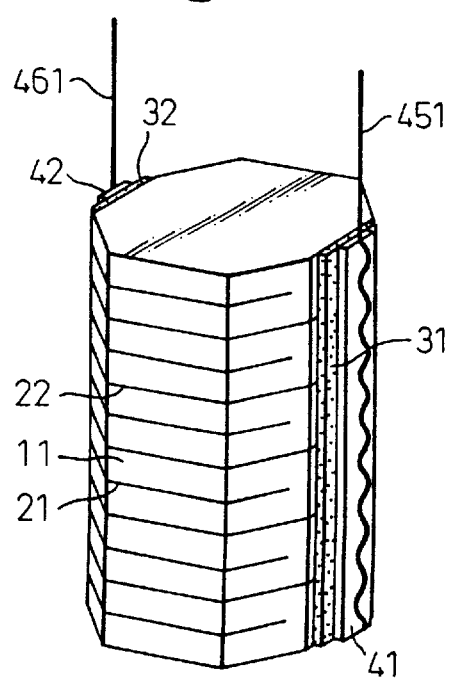
FIG. 12(a) is a perspective view of a piezoelectric device for the injector having wire metal members having a corrugated section each arranged on the corresponding one of first outer electrode layers through the corresponding one of second outer electrode layers.
Figure 12B:
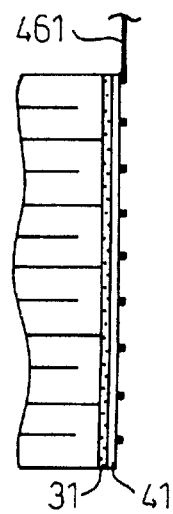
FIG. 12(b) is a diagram for explaining the essential parts of the game piezoelectric device for the injector, according to the fourth embodiment of the invention.

As shown in FIGS. 12a, 12b, corrugated wires can alternatively be used as metal members 451, 461.

In this case, as in the case where corrugated plates are used, the metal members 451, 461 can be provided with a flexibility. The second outer electrode layers 41, 42 and the metal members 451, 461 thus expand/contract with the expansion/contraction of the piezoelectric device 1 for the injector. In this way, the generated stress is reduced and the generation of cracks is suppressed.

A plurality of wires twisted together may alternatively used as a twisted wire.

In this case, the wires by being twisted assume a corrugated form and therefore produce the corrugation effect. At the same time, the plurality of wires twisted can secure conduction more positively.

(Fifth Embodiment)

This embodiment refers to the piezoelectric device 1 for the injector comprising slitted metal members 435, 445 as shown in FIG. 13.

The piezoelectric device 1 for the injector according to this embodiment has a similar configuration to the third embodiment. Specifically, the metal members 435, 445 having slits 430 formed in the direction perpendicular to the stack height of the piezoelectric layers 11 in parallel to the inner electrode layers 21, 22 and the piezoelectric layers 11 in stack are arranged on the first outer electrode layers 31, 32 by way of the second outer electrode layers 41, 42.

The positions of the slits may not be specifically determined.

The slits 430 are configured to open alternately to the end portion on this side and the end portion on the deep side of the metal members 435, 445 in the drawing.

The other detailed points are similar to the corresponding points of the third embodiment.

In the piezoelectric device for the injector according to this embodiment, the provision of the slits 430 can give flexibility to the metal members 435, 445, while at the same time relaxing the stress imposed on the second side electrode layers 41, 42 and the metal members 435, 445 generated by expansion of the piezoelectric device 1 for the injector. Thus, the generation of cracks can be suppressed.

Other shapes of slits formed in the metal members 435, 445 are illustrated below.

FIG. 14(a) shows a metal member 435 having slits 430 similar to those shown in FIG. 13. In addition to this shape, FIG. 14(b) shows wider slits in the same shape as in FIG. 14(a). FIG. 14(c) shows a metal member 435 having slits of various shapes including circle, triangle and rectangle. FIG. 14(d) shows a metal member 43 having a plurality of triangular slits 430. FIG. 14(e) shows a metal member 435 having slits 430 with an internal circle.

A metal member 435 having holes 431 in place of the slits 430 can produce the same functions and effects.

FIG. 15(a) shows a metal member 435 having circular holes 431. FIG. 15(b) shows a metal member 435 having rectangular holes 431. FIG. 15(c) shows a metal member 435 having hexagonal holes 431. FIG. 15(d) shows a metal member 435 having elliptical holes 431. FIG. 15(e) shows a metal member 435 having diagonal holes 431.

Any of the metal members shown in FIGS. 14(a) to 14(e) and 15(a) to 15(e) can produce the same functions and effects according to this embodiment. The shape of the slits 430, 431 is not limited to the ones illustrated above.

(Sixth Embodiment)

Figure 16:
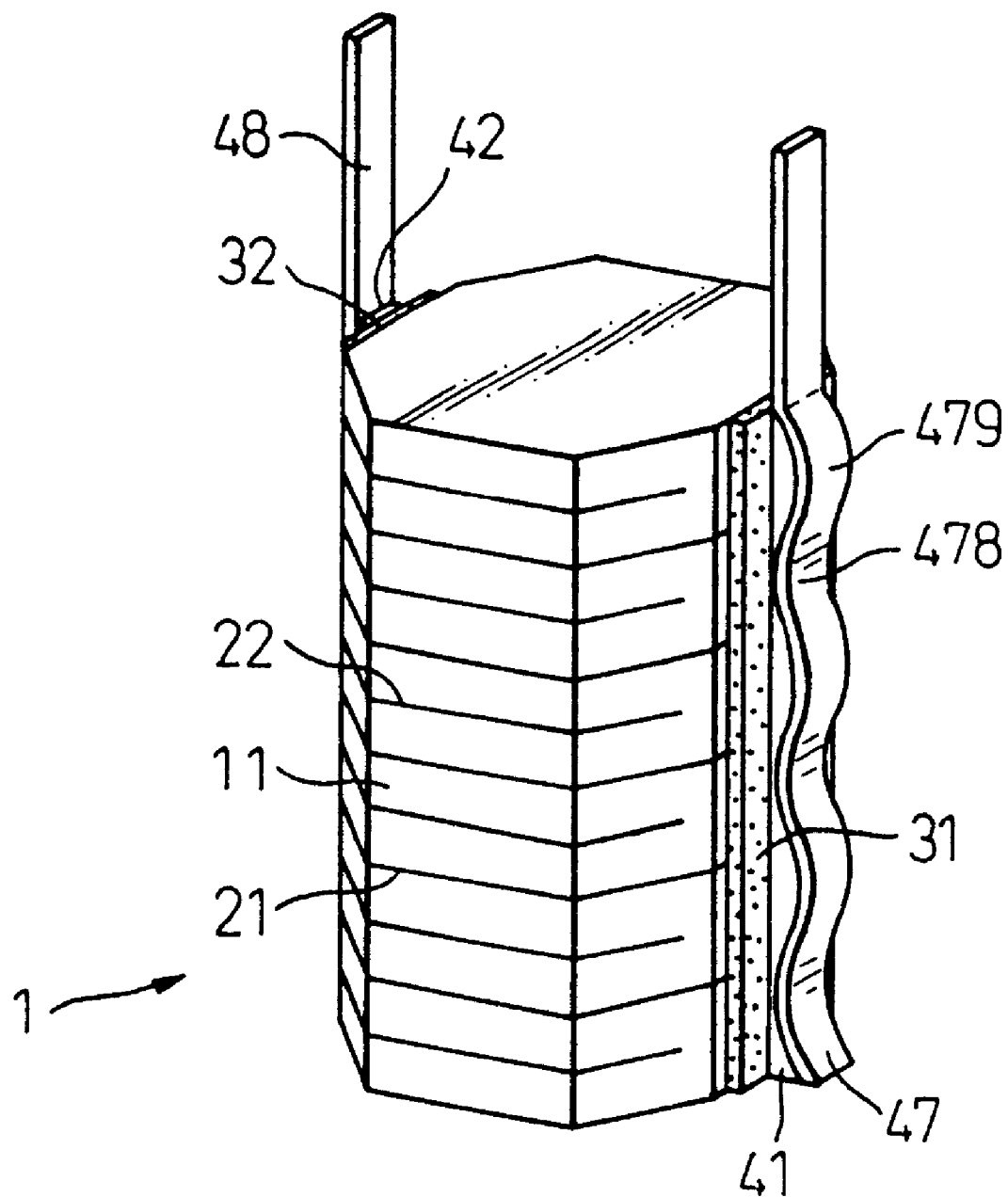
FIG. 16 is a perspective view of a piezoelectric device, for an injector, having a metal member having a corrugated section arranged on each of the first outer electrode layers through a corresponding second outer electrode layer according to a sixth embodiment of the invention.

This embodiment refers to the piezoelectric device 1 for the injector comprising metal members 47, 48 having a corrugated longitudinal section as shown in FIG. 16.

The piezoelectric device 1 for the injector according to this embodiment has a similar configuration to that of the third embodiment. The metal members 47, 48 having a corrugated longitudinal section including ridge portions 479 protruded from the outer peripheral side surface 101 outward and valley portions 478 between each pair of ridge portions 479 are formed on the first outer electrode layers 31, 32 by way of the second outer electrode layers 41, 42, respectively.

Also, the second outer electrode layers 41, 42 are closely filled between the metal members 47, 48 and the first outer electrode layers 31, 32. The second outer electrode layers 41, 42 are substantially as wide as the metal members 47, 48.

The other detailed points are similar to the corresponding points of the first and third embodiments.

With the piezoelectric device 1 for the injector according to this embodiment, the corrugated longitudinal section can give flexibility to the metal members 47, 48, while at the same time relaxing the stress imposed on the second outer electrode layers 41, 42 and the metal members 47, 48 as the result of expansion of the piezoelectric device 1 for the injector. Thus, the generation of cracks or the like can be suppressed.

Also, the filled states of the second outer electrode layers 41, 42 positively couple the second outer electrode layers 41, 42, the metal members 47, 48 and the first outer electrode layers 31, 32 to each other.

Figure 17:
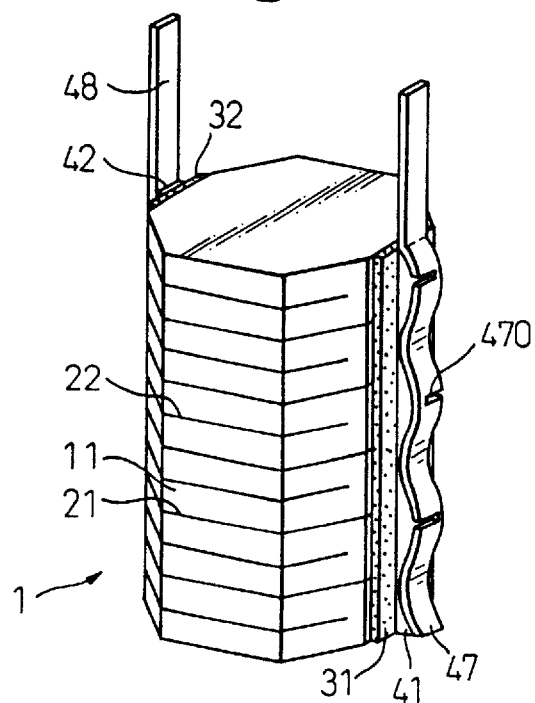
FIG. 17 is a perspective view of a piezoelectric device for the injector having a metal member having slits and a corrugated section arranged on each of the first outer electrode layers through a corresponding second outer electrode layer according to the sixth embodiment of the invention.

As shown in FIG. 17, on the other hand, slits 470 perpendicular to the stack height of the piezoelectric layers and parallel to the piezoelectric layers 11 and the inner electrode layers 21, 22 may be formed in those portions of the metal members 47, 48 having a corrugated longitudinal section which are protruded from the outer peripheral side surfaces of the stack. The second outer electrode layers 41, 42 are closely filled between the metal members 47, 48 and the first outer electrode layers 31, 32. The second outer electrode layers 41, 42 are substantially as wide as the metal members 47, 48.

The slits 470 are configured to open alternately to the end portion on this side and the end portion on the deep side of the metal member 47 in the drawing.

In this case, the metal member 47 can have an added flexibility.

(Seventh Embodiment)

Figure 18:
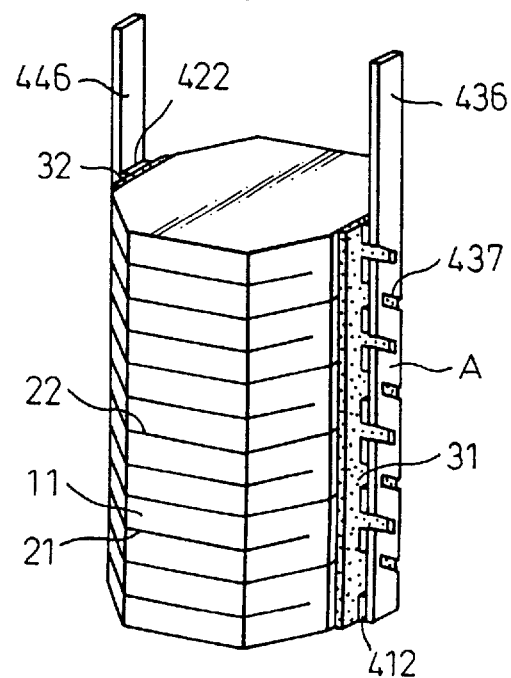
FIG. 18 is a perspective view of a piezoelectric device for the injector having a metal member having diagonal slits arranged on each of the first outer electrode layers through a corresponding second outer electrode layer according to a seventh embodiment of the invention.

As shown in FIG. 18, this embodiment refers to a piezoelectric device for the injector having diagonally slitted metal members.

In the piezoelectric device 1 for the injector according to this embodiment, metal members 436, 446 have slits 437 formed diagonally to the height of the stack and the piezoelectric layers 11 and the inner electrode layers 21, 22. The slits 437, which are formed diagonally to the piezoelectric layers 11 and the inner electrode layers 21, 22, each extend over the piezoelectric layers 11 and the inner electrode layers 21, 22.

The second side electrode layers 412, 422 according to this embodiment are not formed at the positions corresponding to the slits 437.

The other detailed points are similar to the corresponding points of the first and third embodiments.

With the piezoelectric device 1 for the injector according to this embodiment, each pair of adjacent piezoelectric layers 11 and the inner electrode layers 21, 22 can be coupled to each other along the stack height by the portions A between the slits 437. Even in the case where the first outer electrode layers 31, 32 develop a cracking due to the expansion or contraction of the piezoelectric device 1 for the injector, therefore, the electric conduction of the inner electrode layers 21, 22 can be positively secured by the metal members 436, 446.

(Eighth Embodiment)

Figure 19:
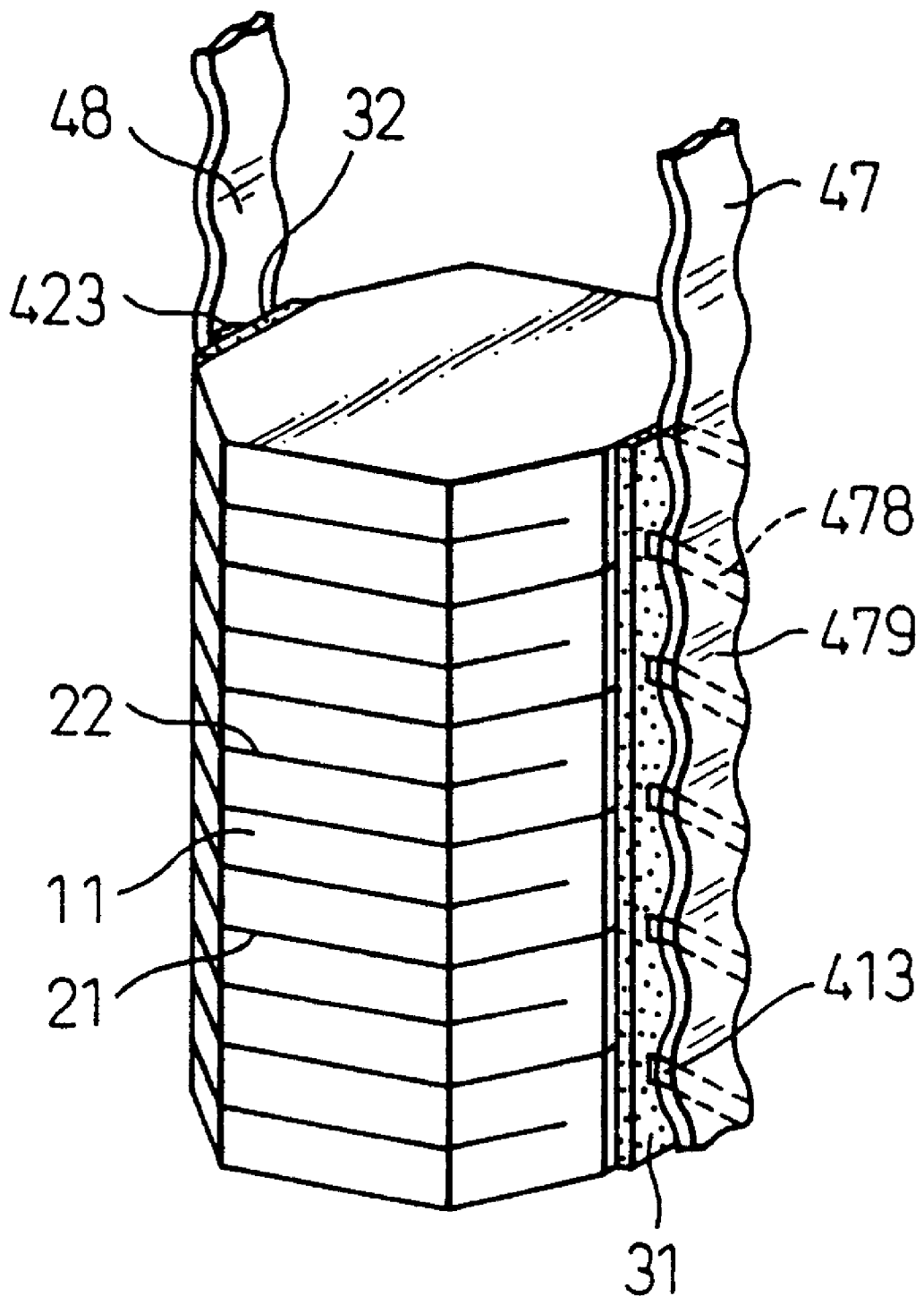
FIG. 19 is a perspective view of a piezoelectric device for the injector having a metal member having a corrugated section and diagonally ridge portions, arranged on each of the first outer electrode layers through a corresponding second outer electrode layer according to an eighth embodiment of the invention.

This embodiment, as shown in FIG. 19, refers to a piezoelectric device 1 for the injector comprising metal members 47, 48 having a corrugated longitudinal section.

The piezoelectric device 1 for the injector according to this embodiment has a similar configuration to that of the seventh embodiment. That is to say, the metal members 47, 48 having a corrugated longitudinal section including ridge portions 479 protruded outward from the outer peripheral side surface 101 of the stack and valley portions 478 recessed between the ridge portions 479 are arranged on the first outer electrode layers 31, 32 by way of the second outer electrode layers 413, 423.

The second outer electrode layers 413, 423 are arranged only at the positions corresponding to the valley portions 478 of the metal members 47, 48.

The ridge portions 479 and the valley portions 478 of the metal members 47, 48 are formed diagonally with respect to and over the piezoelectric layers 11 and the inner electrode layers 21, 22. Therefore, the second outer electrode layers 413, 423 are also formed in such a manner as to extend over the piezoelectric layers 11 and the inner electrode layers 21, 22.

The other detailed points are similar to the corresponding points of the first and third embodiments.

With the piezoelectric device 1 for the injector according to this embodiment, each pair of adjacent piezoelectric layers 11 and the inner electrode layers 21, 22 can be coupled to each other along the stack height by the valley portions 478 of the metal members 47, 48. Even in the case where the first outer electrode layers 31, 32 develop cracks due to the expansion or contraction of the piezoelectric device 1 for the injector, therefore, the electric conduction between the inner electrode layers 21, 22 can be positively secured by the metal members 47, 48.

(Ninth Embodiment)

Figure 20A:
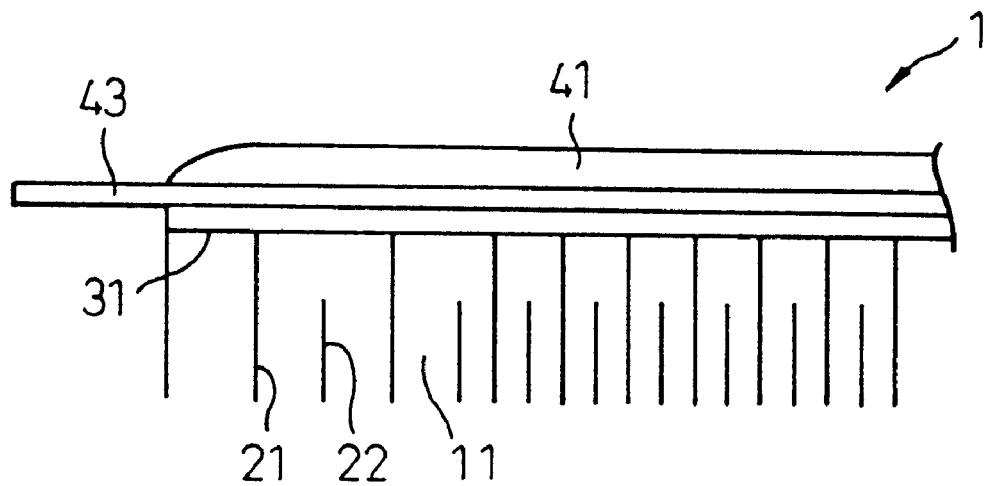
FIGS. 20(a) and 20(b) are sectional views to explain a piezoelectric device for the injector having a metal member embedded in each of the second outer electrode layers according to a ninth embodiment of the invention.
Figure 20B:
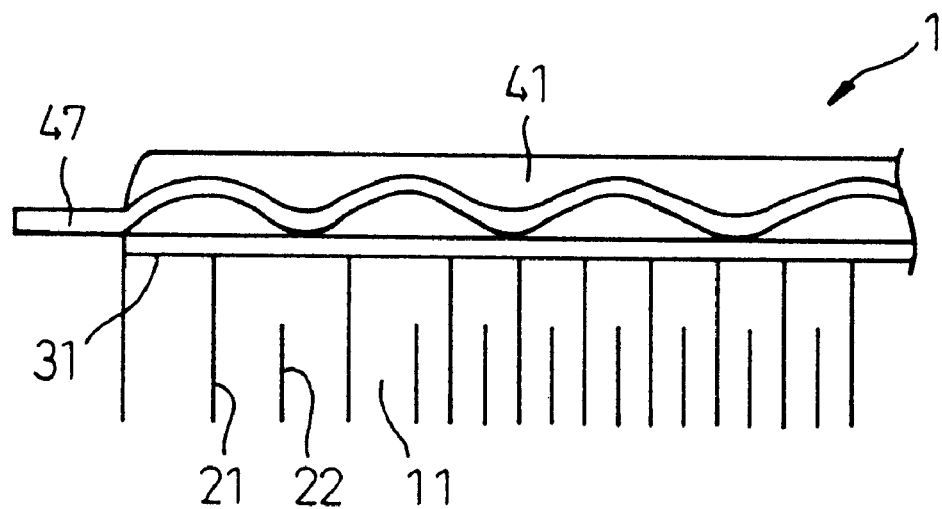

This embodiment, as shown in FIGS. 20(a) and 20(b), refers to the piezoelectric device for the injector in which each metal member is embedded in the corresponding second outer electrode layer and arranged on the corresponding first outer electrode layer Specifically, as shown in FIGS. 20(a), 20(b), a tabular metal member 43 or a metal member 47 having a corrugated longitudinal section is embedded in the second outer electrode layer 41 of resin with silver and fixed on the first outer electrode layer 31.

As a result, the second outer electrode layer 41 and the corresponding one of the metal members 43, 47 can be coupled to each other more positively.

A test is conducted to determine the relation between the thickness of the second outer electrode layers and the coupling strength between the metal members and the second outer electrode layers.

Figure 21:
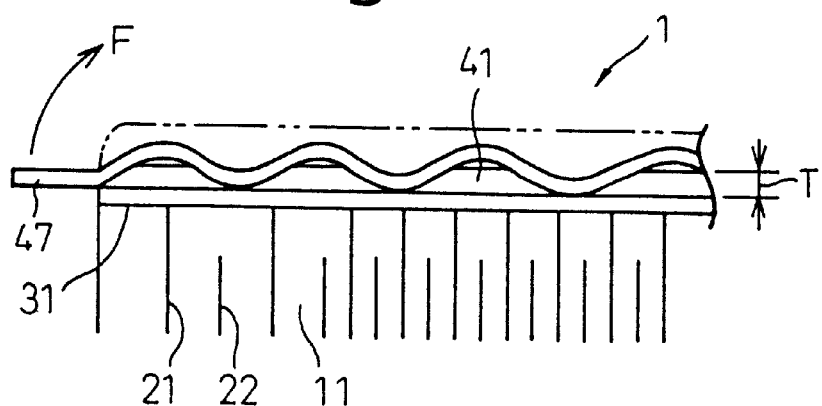
FIG. 21 is a diagram to explain a method of measuring the strength of separation between a metal member and a corresponding second outer electrode layer according to the ninth embodiment of the invention.

As shown in FIG. 21, several samples of the piezoelectric device 1 having different thicknesses T of the second outer electrode layer 41 from the surface of the first outer electrode layer 31 are prepared.

The thickness T is defined as the height from the surface of the first outer electrode layer 31 to the surface of the second outer electrode layer 41. As shown in FIGS. 20(a), 20(b), a sample is also prepared in which the metal member 47 is fully embedded in the second outer electrode layer 41.

The second outer electrode layer 41 is composed of a epoxy resin with silver, and the metal member 47 is composed of a stainless steel sheet having a thickness of 0.05 mm, a wave height of 0.2 mm and a width of 2 mm.

These samples are subjected to a force in the direction of arrow F shown in FIG. 21, and the separation strength of the metal member 47 is measured by autograph. The result is shown in FIG. 22.

Figure 22:
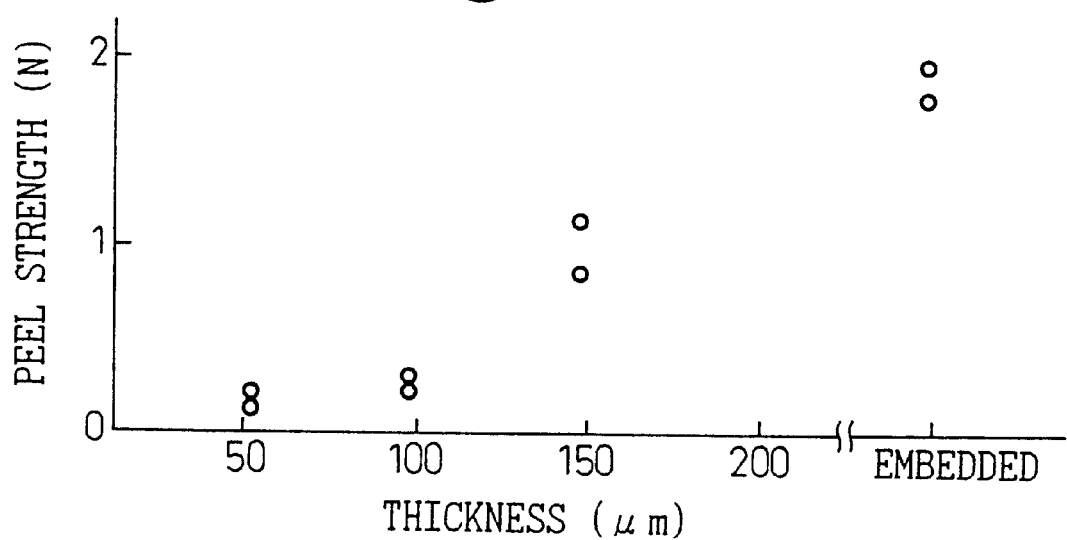
FIG. 22 is a diagram showing the relation between the peel strength and the thickness of the second outer electrode layer according to the ninth embodiment of the invention.

FIG. 22 indicates that the thicker the second outer electrode layer 41, the larger the force, i.e. the larger the peel force required for separating the metal member 47.

A higher peel force is required for the metal member 47 embedded deeper.

In this way, it has been found that the use of the piezoelectric device 1 with the metal member 47 embedded in the second outer electrode layer 41 is desirable especially in applications requiring high durability.

(Tenth Embodiment)

A piezoelectric device for the injector according to this embodiment of the invention will be explained with reference to FIGS. 23 to 26.

Figure 26:
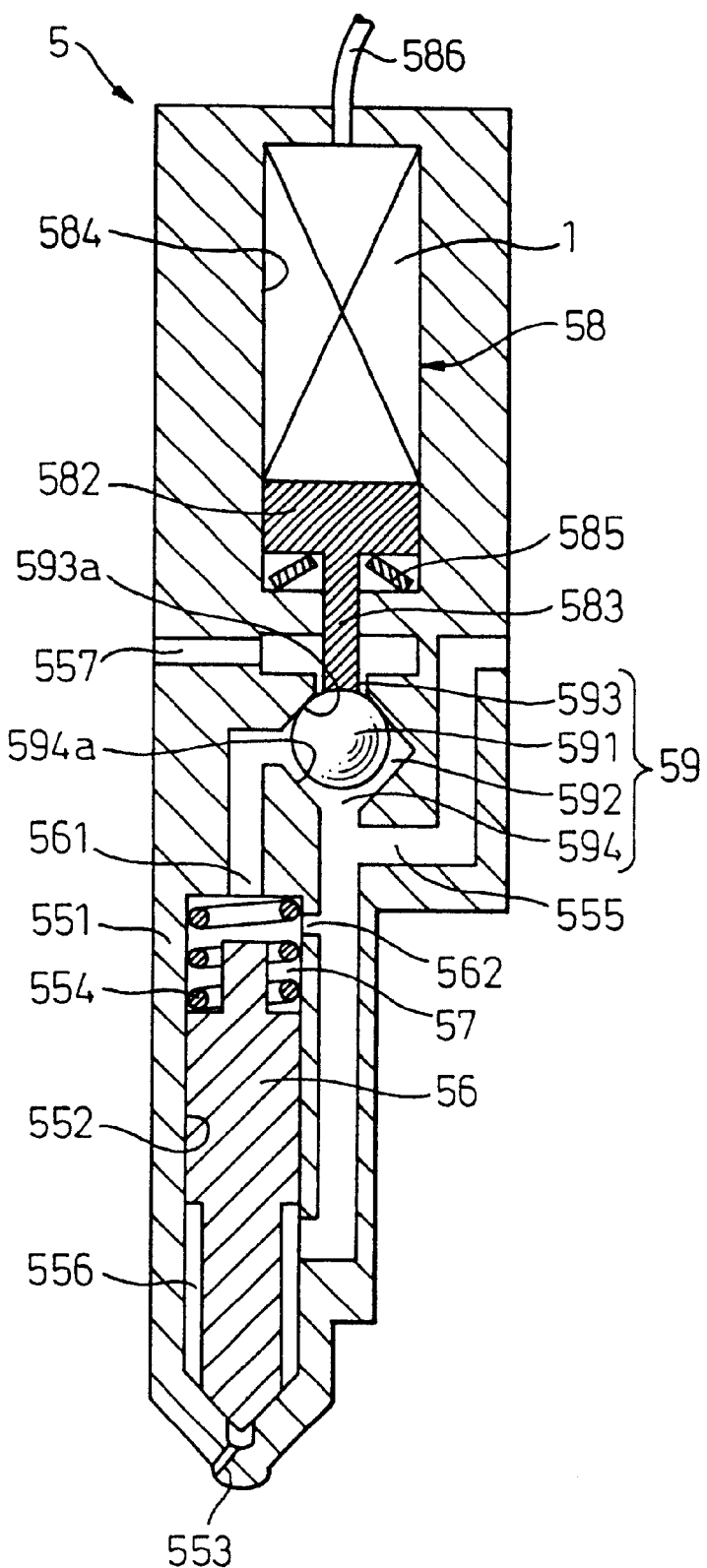
FIG. 26 is a sectional view to explain an injector according to the tenth embodiment of the invention.

The piezoelectric device 1 for the injector according to this embodiment, as shown in FIGS. 23 and 26, is a stack type of piezoelectric device built in the injector 5.

Side electrodes 66, 67 are arranged on the side surfaces 101, 102, respectively, of the piezoelectric device 1, while the external electrodes 4 for securing electrical conduction with external parts are arranged on the outer electrodes 66, 67. The side surfaces 101, 102 are substantially parallel to the direction of expansion/contraction of the piezoelectric device 1.

The external electrodes 4 each include a core member 40 and metal covers 60 for covering at least a portion of the corresponding core member 40, and is coupled to at least a part of the outer electrodes 66, 67.

The specific electrical resistance of the core member 40 is not less than $5 \times 10^{-6}$ ($\Omega \cdot cm$), and that of the metal cover 60 is not more than one half of the specific electrical resistance of the core member.

A detailed description will be given below.

Figure 25A:
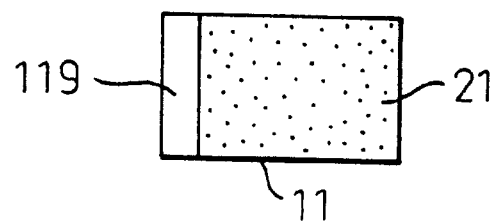
FIGS. 25(a) and 25(b) are plan views of a piezoelectric layer and an inner electrode layer.
Figure 25B:
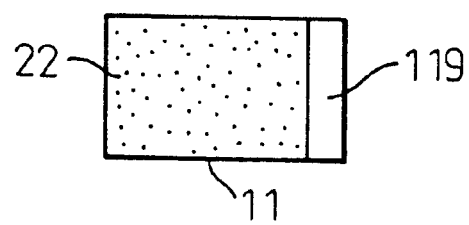
Figure 25C:
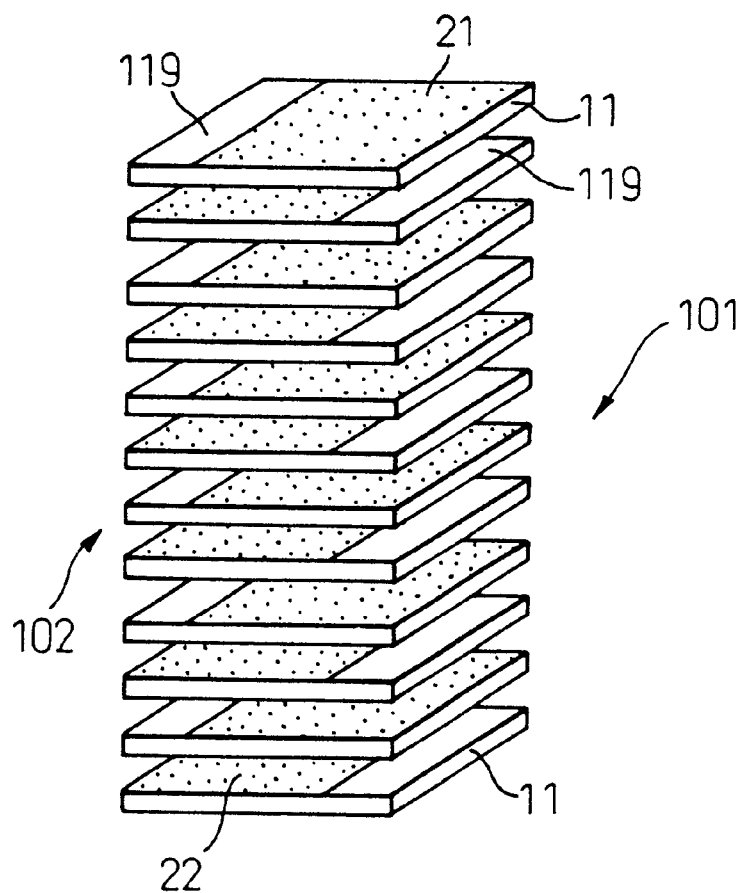
FIG. 25(c) is a perspective exploded view showing the manner in which the piezoelectric layers and the inner electrode layers are stacked one on the other, according to the tenth embodiment of the invention.

The piezoelectric device 1 is formed of the inner electrode layers 21, 22 in alternate positive and negative polarities between the piezoelectric layers 11, as shown in FIGS. 24 and 25. The inner electrode layers 21 are arranged in such a manner as to be exposed to one side surface 101, while the inner electrode layers 22 are arranged to be exposed to the other side surface 102. The side surfaces 101, 102 of the piezoelectric device 1 are formed with the outer electrodes 66, 67, respectively, of sintered silver to assure conduction at the exposed end portions of the inner electrode layers 21, 22.

The sintered silver making up the outer electrodes 66, 67 is composed of the Ag paste containing Ag (97%) and glass frit (3%) used for producing the electrodes, as described later.

As shown in FIG. 23, the external electrodes 4 are coupled by solder 49 on the outer electrodes 66, 67.

The external electrodes 4 according to this embodiment, as shown in FIG. 23, include a pair of core members 40 with the sides thereof covered by metal covers 60, respectively. The core members 40 are each composed of a foil 0.05 mm thick, 2 mm wide and 20 mm long conforming with SUS304. The metal cover 60 is made of silver. The specific electric resistance of the core member 40 is $72 \times 10^{-6}$ ($\Omega \cdot cm$), and that of the metal cover 60 is $1.6 \times 10^{-6}$ ($\Omega \cdot cm$).

According to this embodiment, the two surfaces of the core member 40 are plated with Ni as a substrate, and further plated with semigloss silver about 5 $\mu$m thick as a metal cover 60 of silver. The metal cover 60 covers substantially the entire surface of the core member 40.

In the piezoelectric device 1, as shown in FIG. 24, a drive portion 111 is formed at the central portion along the stack height, buffer portions 112 are arranged to sandwich the drive portion 111, and dummy portions 113 are arranged to sandwich the buffer portions 112.

The method of fabricating and the detailed structure of this piezoelectric device 1 are basically similar to those of the first embodiment described above.

The piezoelectric device 1 according to this embodiment can be produced by the widely-used green sheet method described above.

As the next step, a pattern is screen-printed on one surface of the formed green sheet by a paste composed of seven parts of silver and three parts of palladium (hereafter referred to as the Ag/Pd paste). FIGS. 25(*a*), 25(*b*) show an example of the green sheet with a pattern printed thereon. By way of explanation, substantially the same component parts are designated by the same reference numerals, respectively.

A pattern 21 (22) slightly smaller than the surface area of the green sheet 11 to make up a piezoelectric layer is formed over substantially the entire surface of the green sheet 11 by the Ag/Pd paste described above thereby to form the inner electrode layer 21 (22). One of the opposed sides on the surface of the green sheet 11 is provided with a portion 119 not formed with the inner electrode layer 21 (22). Specifically, one of the end portions (the portion corresponding to the side surface 101 or 102 of the piezoelectric device 1) of the opposed sides of the green sheet does not reach by the inner electrode layer 21 (22), while the opposed other end portion reaches by the inner electrode layer 21 (22).

The inner electrode may be made of such a material as copper, nickel, platinum, silver or a mixture of any combination thereof, as well as the metal described above.

A predetermined number of green sheets 11 formed with the inner electrode layer 21 (22) as described above are prepared to be stacked based on the specification requirement of the displacement of the drive portion 111 and the buffer portions 112. In addition, the required number of green sheets 12 not printed with the inner electrode layer for the buffer portions 112 and the dummy portions 113 are also prepared.

These green sheets 11, 12 are stacked. FIG. 25(*c*) shows a stack of the green sheets 11, 12 and substantially an exploded view of the piezoelectric device 1. This diagram mainly shows the portions involving the drive portion.

The green sheets 11 formed with the inner electrode layer 21 (22) are stacked in such a manner that the portions 119 not formed with the electrode alternate between right and left sides in FIG. 25(*c*). As a result, the inner electrode layer 21 of the green sheet 11 exposed by reaching the right side surface 101 makes up the inner electrode of one polarity, while the inner electrode layer 22 exposed by reaching the left side surface 102 constitutes the inner electrode of the other polarity.

In the central drive portion 111, as shown in FIG. 25(*c*), only the green sheets 11 formed with the inner electrode 21 (22) are stacked. In the buffer portions 112, on the other hand, the green sheets 11 are stacked while the green sheets 12 not formed with the inner electrode layer are interposed between the green sheets 11. In the dummy portions 113, only the green sheets 12 not formed with the inner electrode layers are stacked.

Consequently, a stack having the structure as shown in FIGS. 23, 24 is produced.

Then, after thermal compression bonding using a hot water rubber press or the like, the assembly is degreased at 400 to 700° C. in the electric furnace, and calcinated at 900 to 1200° C.

The Ag paste described above is coated on the side surfaces of the stack and cured thereby to form the outer electrodes 66, 67. instead of configuring the outer electrodes of sintered silver, the Ag/Pd paste can be cured to form the outer electrodes. Other alternatives include copper, nickel, platinum, silver-palladium alloy, etc.

The outer electrode 66 on the right side in FIG. 23 is formed at the positions where the inner electrode layers 21 of one polarity are exposed to secure conduction of each inner electrode layer 21. The other outer electrode 67 on the left side in FIG. 23, on the other hand, is formed at the positions where the inner electrode layers 22 of the other polarity are exposed to secure the conduction of each inner electrode layer 22.

After that, the external electrodes 4 are coupled by high-temperature soldering to the upper end portions of each of the outer electrodes 66, 67.

The method that can be employed for coupling the external electrodes 4 includes such means as brazing, a fixing band, etc. as well as soldering. Further, the external electrodes 4 and the outer electrodes 66, 67 can of course be coupled partially or wholly in the aforementioned manner.

The external electrodes 4 are each produced in such a manner that a substrate is formed by plating Ni on the two surfaces of a foil member conforming with SUS304, and the resulting assembly is plated with semigloss silver to the thickness of about 5 $\mu$m.

After that, a DC voltage is applied between the inner electrode layers 21, 22 of the stack through the outer electrodes 66, 67 from the external electrodes 4 thereby to polarize the piezoelectric layers 11 and produce the piezoelectric device 1.

The green sheets (piezoelectric layers) 12 having the same substance as the piezoelectric layers 11 used with the drive portion 111 are used for the dummy portions 113. In this way, by suppressing the increase in the types of production materials, the production cost can be reduced.

An insulating coating 0.005 mm or thicker (not shown) is formed over the whole of the side surfaces 101, 102 substantially parallel to the direction of expansion or contraction of the piezoelectric device 1. In this embodiment, silicone resin is used as the insulating coating.

Now, a brief explanation will be given of an example of the injector which can use the piezoelectric device 1 having the aforementioned configuration as a drive source.

The injector 5, as shown in FIG. 26, is used for injecting the fuel of the high pressure stored in a common rail to each cylinder in a common rail fuel injection system. In FIG. 26, a cylinder 552 formed at the lower end of the valve housing 551 accommodates the nozzle needle 56 slidably. The forward end portion of the nozzle needle 56 is in contact with the injection hole 553 at the forward end portion of the valve housing 551 thereby to close the injection hole 553.

The upper end portion of the cylinder 552 is formed with a control chamber 57 for imparting pressure to the nozzle needle 56 in such a direction as to close the valve, so that with the increase/decrease of the oil pressure within the control chamber 57, the nozzle needle 7 moves upward/downward. Also, a spring 554 for energizing the nozzle needle 56 in the direction of closing the nozzle needle 56. The nozzle needle 56 has the lower half portion thereof slightly smaller in diameter to form an annular space 555 which constitutes a fuel pool 556 communicating with the high-pressure path 555.

The intermediate portion of the valve housing 551 has therein a three-way valve 59 for increasing/decreasing the internal pressure of the control chamber 57. The three-way valve 59 includes a valve chamber 592 having a drain port 593 acting as a low-pressure port at the upper end thereof and a high-pressure port 594 at the lower end thereof, and a ball-shaped valve body 591 arranged in the valve chamber 592 for opening/closing the drain port 593 or the high-pressure port 594. The drain port 593 communicates with a low-pressure portion, not shown, of the system through a drain path 557 constituting a low-pressure path, while the high-pressure port 594 communicates with an external high-pressure fuel source (common rail) through a high-pressure path 555.

The valve body 591 is driven by a piezo actuator 58 encased in the upper end portion of the valve housing 551. The piezo actuator 58 includes a piezoelectric device 1 adapted to expand/contract upon application of a voltage thereto and a piezo piston 582 in contact with the lower end surface of the piezoelectric element 1 and slidable in a cylinder 584. A rod 583 extending downward from the central portion of the lower end surface of the piezo piston 582 is in contact with the valve body 591 through the interior of the high-pressure port 594. Upon vertical motion of the piezo piston 582 with the expansion/contraction of the piezoelectric device 1, the rod 583 is moved vertically and integrally. At the same time, the valve body 591 comes into contact with a tapered sheet surface 593a leading to the drain port 593 or a tapered sheet surface 594a leading to the high-pressure port 594, so that the port 593 or 594 is selectively closed.

A coned disk spring 585 is arranged in the cylinder 584 under the piezo piston 582, through which the piezoelectric device 1 is urged upward (in the direction of contraction).

The upper end surface of the piezoelectric device 1 is connected with a lead wire 586 for voltage application and connected electrically to the two external electrodes 4 described above.

A main orifice 561 is interposed between the upper end surface of the control chamber 57 and the side portion of the valve chamber 592. The main orifice 561 establish constant communication between the control chamber 57 and the valve chamber 592. Specifically, the control chamber 57 selectively communicates with the drain path 557 or the high-pressure path 555 in accordance with the seat position of the valve body 591 thereby to increase or decrease the hydraulic force acting on the nozzle needle 56.

On the other hand, the control chamber 57 communicates all the time with the high-pressure path 555 by way of a suborifice 562 open to the side surface so that a high-pressure fuel is introduced continuously from the high-pressure path 555. According to this embodiment, the suborifice 562 functions to decrease the rate of drop and increase the rate of rise of the oil pressure of the control chamber 57 applied to the nozzle needle 56. Preferably, the diameter of the suborifice 562 is set to the same as or smaller than the diameter of the main orifice 561.

The operation of the injector 5 configured as described above will be briefly explained.

Figure 27:
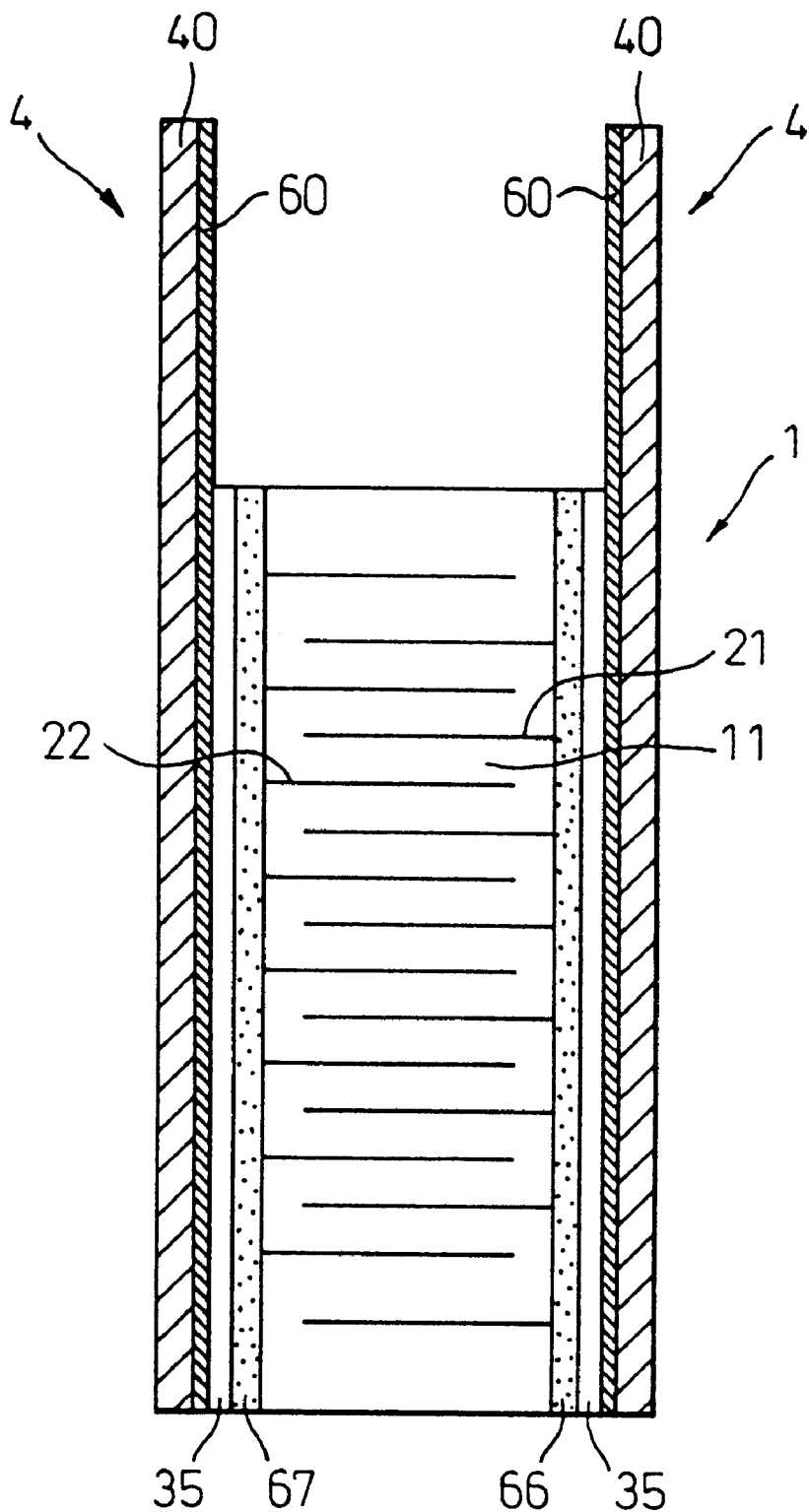
FIG. 27 is a sectional view to explain the configuration of a piezoelectric device according to an 11th embodiment of the invention.
Figure 28:
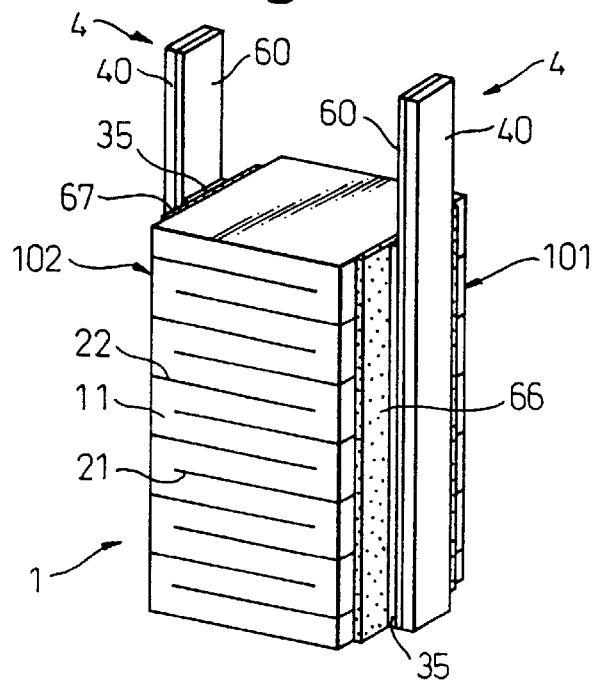
FIG. 28 is a perspective view of a piezoelectric device according to the 11th embodiment of the invention.

Under the condition shown in FIG. 27, the valve body 591 of the three-way valve 59 closes the drain port 593 and opens the high-pressure port 594 by contacting the upper seat surface 543a. The control chamber 57 communicates with the high-pressure path 555 through the main orifice 561 and the suborifice 562. The nozzle needle 56 is energized by the oil pressure in the control chamber 57 and the spring 554 to close the injection hole 53.

When opening the nozzle needle 56 from this state, a voltage is applied through the lead wire 586 to the piezoelectric device 1 of the piezo actuator 58 thereby to extend the piezoelectric device 1 against the spring force of the coned disk spring 555. Then, the rod 583 of the piezo piston 582 pushes down the valve body 591 that has thus far been in contact with the upper seat surface 593a leading to the drain port 593 thereby to open the drain port 593, followed by bringing the valve body 591 into contact with the lower seat surface 594a thereby to close the high-pressure port 594. As a result, the control chamber 57 comes to communicate with the drain path 557, and fuel flows out through the main orifice 561 and the valve chamber 592 thereby to decrease the oil pressure of the control chamber 57.

When closing the nozzle needle 56, on the other hand, the voltage applied to the piezoelectric device 1 of the piezo actuator 58 is decreased. Then, the piezoelectric device 1 is contracted, the piezo piston 582 is moved upward by the spring force of the coned disk spring 555, and the upward oil pressure of the high-pressure port 594 is exerted on the valve body 591. The valve body 591 thus comes away from the lower seat surface 594a thereby to open the high-pressure port 594, and further, coming into contact with the upper seat surface 593a, closes the drain port 593. As a result, the control chamber 593a communicates with the high-pressure path 555 through the valve chamber 592, so that the oil pressure in the control chamber 57 is increased by the high-pressure fuel flowing in through the main orifice 561.

In view of the fact that the control chamber 57 communicates all the time with the high-pressure path 555 through the sub orifice 562, the high-pressure fuel flows into the control chamber 57 from both the main orifice 561 and the suborifice 562. As a result, the oil pressure in the control chamber 57 rapidly increases, and when the sum of the oil pressure of the control chamber 57 and the urging force of the spring 554 exceeds the oil pressure of the fuel pool 556, the nozzle needle 56 rapidly moves down. Thus, the nozzle needle 56 is rapidly closed to stop fuel injection.

The functions of this embodiment will be explained.

According to this embodiment, the external electrodes 4 each include the core member 40 and the metal cover 60, and the specific electric resistance of these component parts are set to the specific values described above. Specifically, the specific electric resistance of the core member 40 is set to $72 \times 10^{-6}$ ($\Omega \cdot cm$) which is much larger than $5 \times 10^{-6}$ ($\Omega \cdot cm$). In the case where an external electrode configured of only the core member 40 is used, therefore, the energy consumption increases extremely when current flows.

The metal cover 60, whose specific electric resistance is $1.6 \times 10^{-6}$ ($\Omega \cdot cm$), has a sufficient electrical conductivity. By applying the metal cover 60 on the core member 40, therefore, the electrical conductivity of the core member 40 is supplemented. Thus, the electric conductivity of the external electrode 4 as a whole remarkably increases. As a result, the energy consumed by the electrical resistance of the external electrode 4 can be reduced, thereby making it possible to suppress the energy consumption of the whole piezoelectric device 1.

According to this embodiment, the functions described above are quantitatively measured using the injector 5.

Specifically, in addition to the piezoelectric device 1, a reference piezoelectric device having an external electrode configured of only the core member 40 without the metal cover 60 is prepared. The piezoelectric device 1 and the reference piezoelectric device are mounted one by one on the injector 5, which is activated under the same conditions. In this way, the energy consumed by the external electrode for each fuel injection cycle is measured and calculated.

The energy consumption is found to be 7.2 mJ for the reference piezoelectric device in which the external electrode is made of only the one conforming with SUS304 with the specific electric resistance of $72 \times 10^{-6}$ ($\Omega \cdot cm$).

In the case of the piezoelectric device 1 in which the external electrode conforming with SUS304 is formed with a silver-plated metal cover having a specific electric resistance of $1.6 \times 10^{-6}$ ($\Omega \cdot cm$), on the other hand, the energy consumption is found to be 0.6 mJ, which is a surprising one tenth or less.

As understood from this test result, the use of the piezoelectric device 1 according to this embodiment for the injector 5 reduces both the burden on the control circuit for controlling the piezoelectric device and the size of the circuit configuration. As a result, the injector 5 having the piezoelectric device 1 can suppress the energy consumption and provides a practicable injector having a superior high-speed responsiveness.

Further, according to this embodiment, a material conforming with SUS304 is used for the core member 40. Therefore, the tensile strength is not less than 500 MPa and some degree of elasticity is provided. As a result, the durability against the expansion or contraction of the piezoelectric device 1 can be improved.

Furthermore, according to this embodiment, a substrate member is interposed to reduce the distance between the core member 4 and the metal cover 60. Thus, the force of closely attaching the core member and the metal cover to each other can be improved for a further increased durability of the piezoelectric device 1.

(11th Embodiment)

This embodiment refers to a modification of the configuration and a method of arrangement of the external electrodes 4 in the tenth embodiment. The other points of structure are similar to the corresponding points of the tenth embodiment.

The external electrode 4 according to this embodiment is such that only the surface of the core member 40 nearer to the outer electrodes 66, 67 is formed with the metal cover 60.

The core member 40 is made of a copper beryllium foil 2 mm wide and 0.05 mm thick. One of the surfaces of the core member 40 is formed with the metal cover 60 by being plated with silver directly. This metal cover 60 is also a semigloss silver plating such as the corresponding one of the tenth embodiment.

According to this embodiment, the external electrodes 4 are coupled by use of a conductive adhesive 35 containing silver. Specifically, the conductive adhesive 35 is coated on the outer electrodes 66, 67, and the external electrode 4 is coupled through the adhesive coating.

The conductive adhesive 35 contains 80% silver and 20% epoxy resin.

In this case, the silver plating formed on the external electrode 4 is coupled to the conductive adhesive 35. Thus, the increase in electrical resistance (interface resistance) in the boundary surface between the outer electrodes 66, 67 and the core member 40 or the metal cover 60 due to age degradation can be suppressed. In this way, the durability of the piezoelectric device 1 can be further improved.

The other functions and effects are similar to those of the first embodiment.

In this embodiment, the conductive adhesive is used to couple the external electrode to the outer electrodes. As an alternative, the outer electrodes may be formed of a conductive adhesive to connect an external electrode.

(12th Embodiment)

Figure 29:
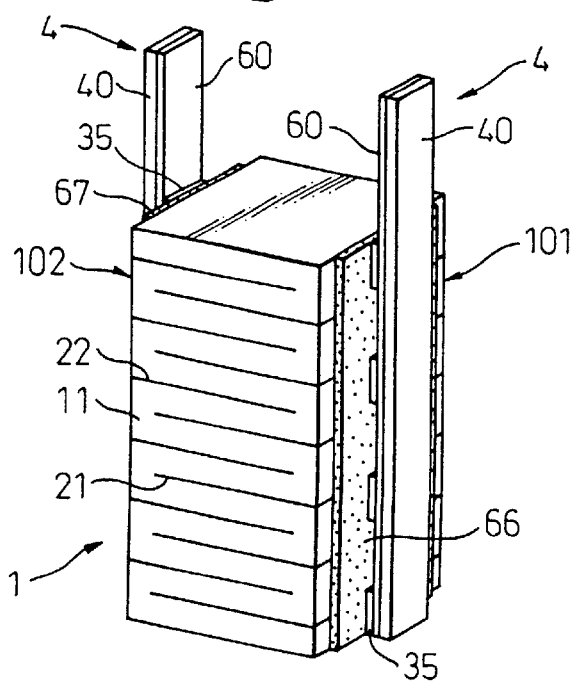
FIG. 29 is a perspective view of a piezoelectric device according to a 12th embodiment of the invention.

This embodiment refers, as shown in FIG. 29, to a modification of the manner in which the conductive adhesive 35 according to the 11th embodiment is arranged.

Specifically, as shown in FIG. 29, the conductive adhesive 35 is arranged partially in the direction of expansion/contraction of the piezoelectric layers 11, to which the external electrodes 4 are coupled. The other points are similar to the corresponding points of the 11th embodiment.

In this case, the stress imposed on the conductive adhesive 35 by the expansion and contraction of the piezoelectric device 1 can be reduced and cracking or the like of the conductive adhesive 35 can be suppressed.

(13th Embodiment)

Figure 30:
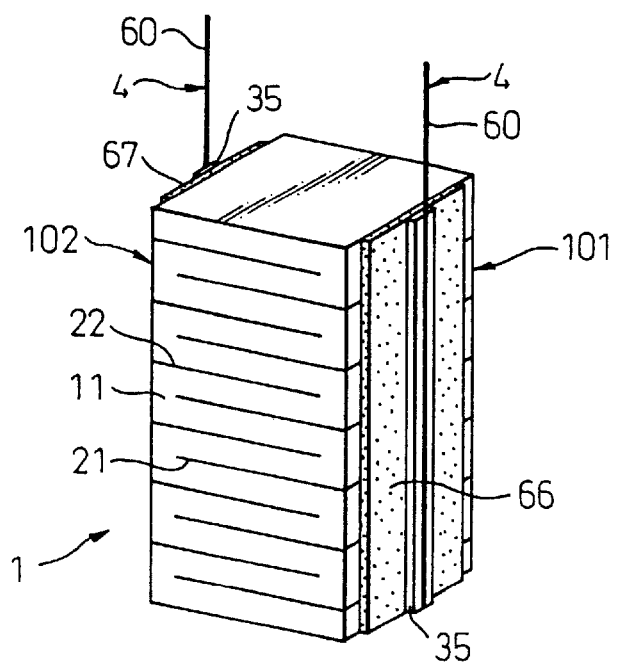
FIG. 30 is a perspective view of a piezoelectric device according to a 13th embodiment of the invention.

This embodiment refers to the piezoelectric device 1 having a wire member constituting the external electrode 4, as shown in FIG. 30.

Specifically, as shown in FIG. 30, according to this embodiment, the external electrodes 4 are so configured that the whole surface of the core member of a material conforming with SUS304 having the diameter of +0.3 mm is formed with a metal cover 60 of the same silver plating as in the tenth and 11th embodiments. The other points are similar to the corresponding points of the 11th embodiment.

In this case, the space occupied by the external electrodes 4 can be reduced and a more compact piezoelectric device can be produced.

(14th Embodiment)

Figure 31:
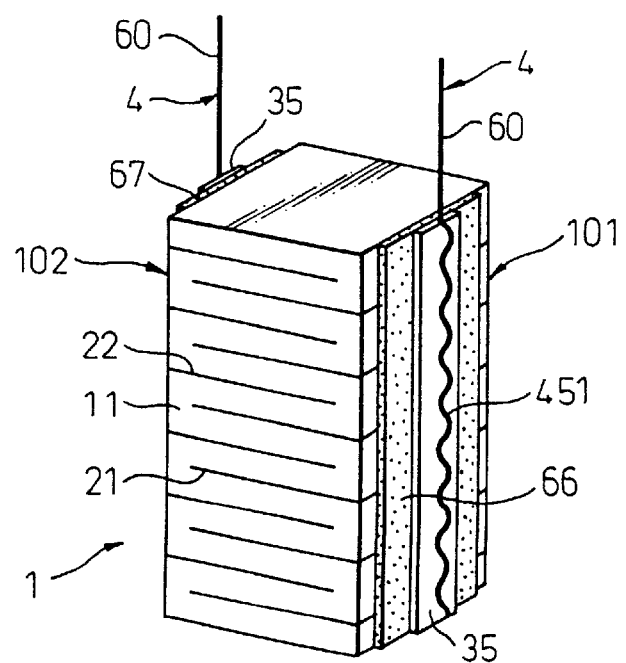
FIG. 31 is a perspective view of a piezoelectric device according to a 14th embodiment of the invention.

This embodiment refers to the case in which a corrugated wire member is used as each of external electrodes 4, as shown in FIG. 31. Specifically, the wire member having a similar configuration to that of the 13th embodiment is corrugated for use as an external electrode 4, and coupled on the corresponding conductive adhesive 35 by being arranged with the waveform extending along the conductive adhesive 35. The other points are similar to the corresponding points of the 13th embodiment.

In this case, the external electrodes 4 can be geometrically provided with flexibility. Thus, the external electrodes 4 are easily expanded or contracted with the expansion or contraction, as the case may be, of the piezoelectric device 1. In this way, the generated stress is reduced, and the generation of cracking can be further suppressed.

(15th Embodiment)

This embodiment represents a case employing external electrodes 4 having slits 430, as shown in FIG. 32. Specifically, the slits 430 are formed alternately on the left and right sides of the tabular external electrodes 4 each made of a core member 40 and a metal cover 60 similar to those of the 11th embodiment. The assembly is coupled on the side electrodes 66, 67 by a conductive adhesive 35. The other points are similar to the corresponding points of the 11th embodiment.

In this case, the provision of the slits 430 can geometrically give flexibility to the external electrodes 4. As a result, the stress imposed on the piezoelectric device 1 when expanding can be reduced, and the generation of cracking or the like can be suppressed.

(16th Embodiment)

This embodiment, as shown in FIG. 33, represents a case employing tabular external electrodes 4 having a corrugated longitudinal section.

Specifically, each tabular external electrode 4 having the core member 40 and the metal cover 60 similar to the corresponding parts of the 11th embodiment is produced to have a corrugation by alternating between a ridge portion 479 and a valley portion 478. The tabular external electrode 4 is coupled to each of the outer electrodes 66, 67 by a conductive adhesive 35.

Also, the conductive adhesive 35 is closely filled between each external electrode 4 and the corresponding one of the outer electrodes 66, 67. The conductive adhesive 35 is arranged in a width substantially equal to the width of the external electrode 4. The other points are similar to the corresponding points of the 11th embodiment.

In this case, too, the external electrodes 4 can be geometrically given flexibility, and the stress imposed on the piezoelectric device 1 at the time of expansion can be reduced. Thus, the generation of cracking or the like can be reduced.

Also, in view of the fact that the conductive adhesive 35 is closely filled, the external electrode 4 and the corresponding one of the side electrodes 66, 67 can be accurately coupled to each other.

Figure 34:
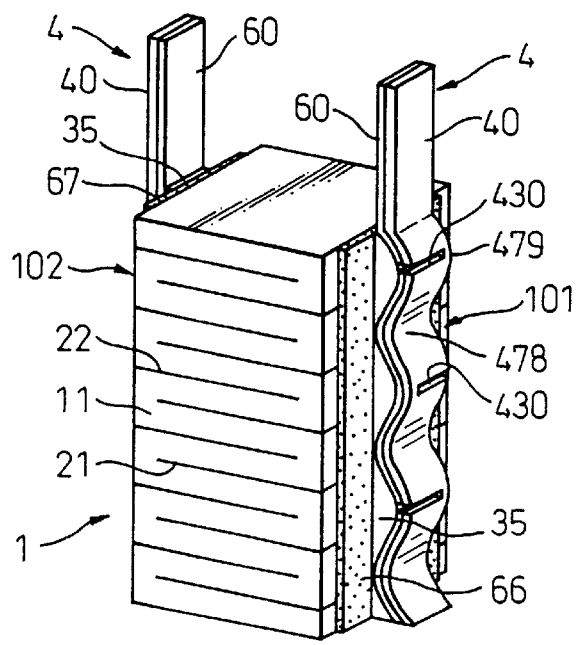
FIG. 34 is a perspective view of another example of piezoelectric device according to the 16th embodiment of the invention.

As shown in FIG. 34, slits 430 perpendicular to the direction of expansion/contraction of the piezoelectric device can be formed at the ridge portions 479 of the is external electrode 4.

In this case, the external electrodes 4 can be given more flexibility.

(17th Embodiment)

Figure 35:
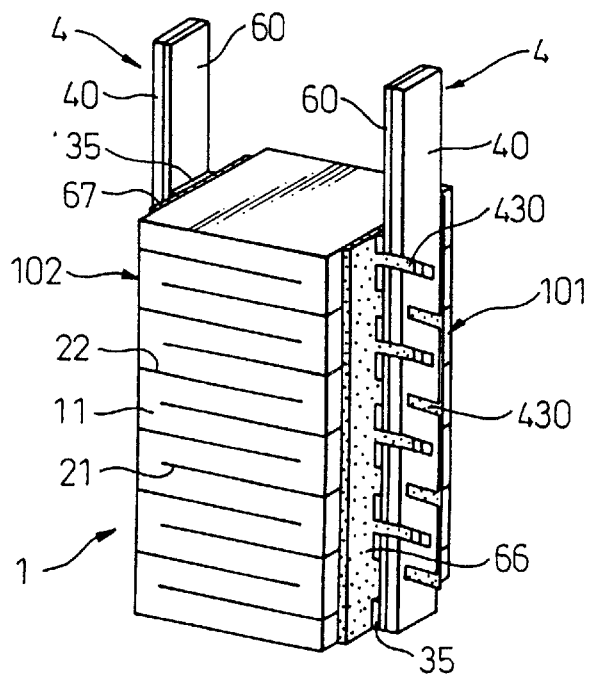
FIG. 35 is a perspective view of a piezoelectric device according to a 17th embodiment of the invention.

This embodiment represents, as shown in FIG. 35, a case employing external electrodes 4 having diagonal slits 430.

Specifically, according to this embodiment, the tabular external electrode 4 including a core member 40 and a metal cover 60 similar to the corresponding parts of the 12th embodiment is formed with diagonal slits alternately on the left and right sides. The external electrode 4 thus formed with slits is coupled on the outer electrodes 66, 67 by the conductive adhesive 35 diagonally arranged between the slits. The other points are similar to the corresponding points of the 11th embodiment.

In this case, too, functions and effects similar to those of the embodiments described above can be produced.

(18th Embodiment)

Figure 36:
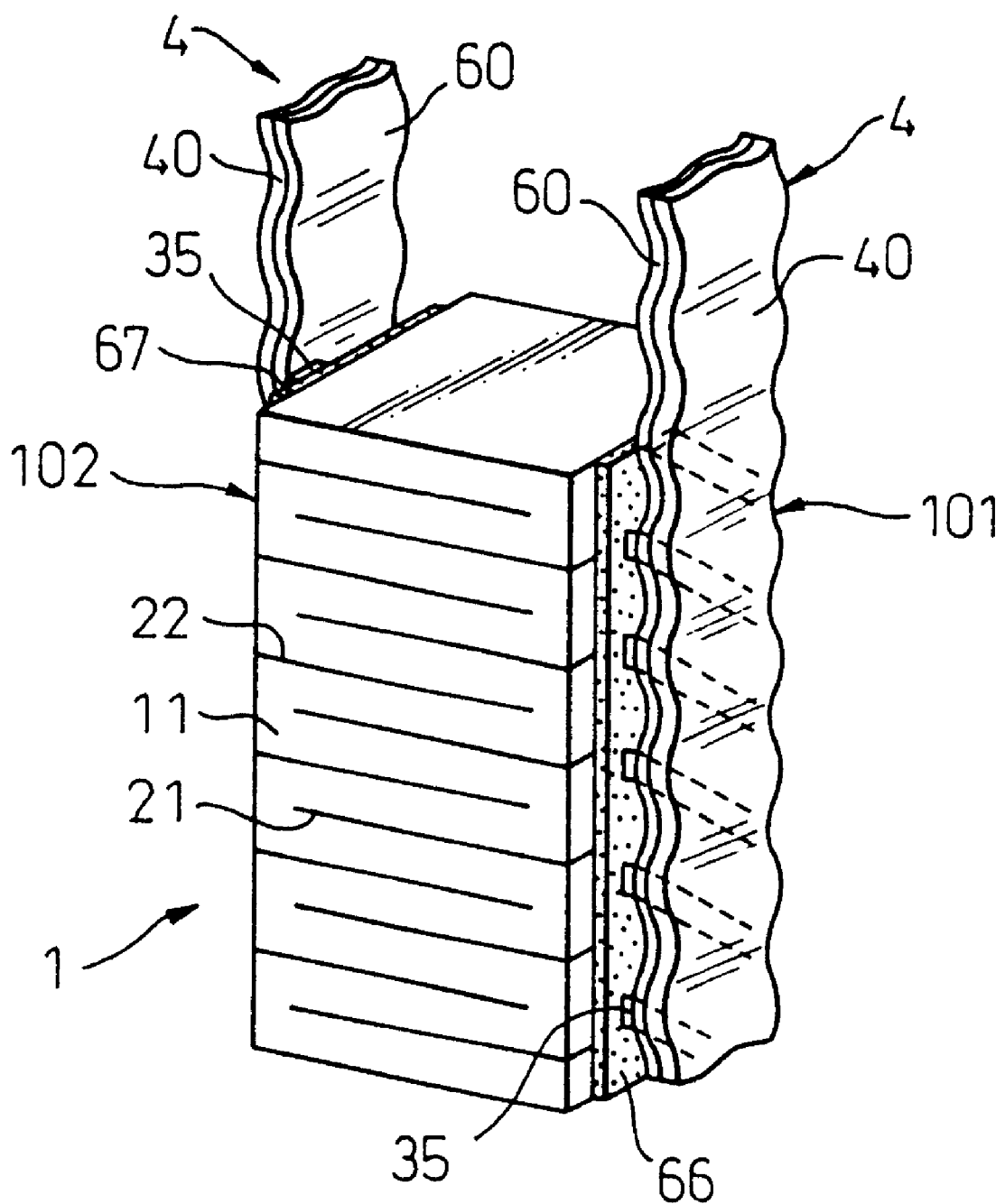
FIG. 36 is a perspective view of a piezoelectric device according to an 18th embodiment of the invention.

This embodiment, as shown in FIG. 36, represents a case employing corrugated external electrodes 4 such as in the 16th embodiment with ridge portions 479 and valley portions 478 arranged diagonally. According to this embodiment, the external electrodes are coupled by the conductive adhesive 35 arranged along the diagonal valleys 748. The other points are similar to the corresponding parts of the 11th embodiment.

In this case, too, similar functions and effects to those of the aforementioned embodiments can be produced.

What is claimed is:

1. A piezoelectric device, built in a fuel injector, for generating the driving force for the injector, comprising;
   a plurality of piezoelectric layers adapted to expand or contract in accordance with the applied voltage and a plurality of inner electrode layers for supplying the applied voltage, said piezoelectric layers and said inner electrode layers being stacked alternately with each other;
   a pair of first outer electrode layers formed on the outer peripheral sides, respectively, of the piezoelectric device for the injector in such a manner that adjacent ones of said outer electrode layers alternately assume electrically positive and negative polarities; and
   second outer electrode layers formed on the first outer electrode layers, respectively, and made of a conductive material having a larger breaking elongation than the first outer electrode layers.

2. A piezoelectric device for an injector, according to claim 1, in which said second outer electrode layers are configured of a conductive material having a breaking elongation of 1.5% or higher.

3. A piezoelectric device for an injector, according to claim 1, in which said second outer electrode layers are configured of a mixture of a metal material and a resin material.

4. A piezoelectric device for an injector, according to claim 3, in which said resin material of said mixture is at least a selected one of silicone, epoxy, polyimide and vinyl phenol.

5. A piezoelectric device for an injector, according to claim 1, in which a selected one of the first outer electrode layer and the second outer electrode layer is composed of a metal material containing Ag.

6. A piezoelectric device for an injector, according to claim 1, in which the distortion of said piezoelectric device is not less than 0.05% and the possible number of drive cycles is at least $10^9$.

7. A piezoelectric device, built in an injector, for generating a drive force for the injector, comprising:
   a plurality of piezoelectric layers adapted to expand or contract in accordance with the applied voltage and a plurality of inner electrode layers for supplying the applied voltage, said piezoelectric layers and said inner electrode layers being stacked alternately with each other;
   a pair of first outer electrode layers formed on the outer peripheral sides, respectively, of the piezoelectric device for the injector in such a manner that adjacent ones of said outer electrode layers alternately assume electrically positive and negative polarities; and
   metal members coupled to said first outer electrode layers, respectively, through second outer electrode layers of a conductive material having a larger breaking elongation than said first outer electrode layers.

8. A piezoelectric device for an injector, according to claim 7, in which said second outer electrode layers are formed of a conductive material having a breaking elongation of 1.5% or higher.

9. A piezoelectric device for an injector, according to claim 7, in which said second outer electrode layers are configured of a mixture of a metal material and a resin material.

10. A piezoelectric device for an injector, according to claim 9, in which said resin material of said mixture is at least a selected one of silicone, epoxy, polyimide and vinyl phenol.

11. A piezoelectric device for an injector, according to claim 7, in which selected one of said first outer electrode layer and said second outer electrode layer is composed of a metal material containing Ag.

12. A piezoelectric device for an injector, according to claim 7, in which said metal members are each formed of a metal plate having a corrugated section.

13. A piezoelectric device for an injector, according to claim 7, in which said metal members are each formed of an elastic member.

14. A piezoelectric device for an injector, according to claim 7, in which said metal members are each formed of a metal plate having slits or holes.

15. A piezoelectric device for an injector, according to claim 7, in which said metal members are each formed of stainless steel or copper.

16. A piezoelectric device for an injector, according to claim 7, in which said metal members are each embedded in the corresponding one of said second outer electrode layers.

17. A piezoelectric device, built in an injector, for generating a drive force for the injector, comprising:

a plurality of piezoelectric layers adapted to expand or contract in accordance with the applied voltage and a plurality of inner electrode layers for supplying the applied voltage, said piezoelectric layers and said inner electrode layers being stacked alternately with each other;

a pair of first outer electrode layers formed on the outer peripheral sides, respectively, of the piezoelectric device for the injector in such a manner that adjacent ones of said outer electrode layers alternately assume electrically positive and negative polarities; and metal members coupled to said first outer electrode layers, respectively, through second outer electrode layers of a conductive material having a larger breaking elongation than said first outer electrode layers;

wherein said metal members are each formed of a metal plate having a corrugated section; and said metal plates having a corrugated section each have ridge portions protruded outward of the outer peripheral side surface of the piezoelectric device for the injector and valley portions each located between adjacent two of said ridge portions, and in which at least some of said ridge portions and said valley portions are formed diagonally over said piezoelectric layers and said inner electrode layers constituting said piezoelectric device.

18. A piezoelectric device, built in an injector, for generating a drive force for the injector, comprising:

a plurality of piezoelectric layers adapted to expand or contract in accordance with the applied voltage and a plurality of inner electrode layers for supplying the applied voltage, said piezoelectric layers and said inner electrode layers being stacked alternately with each other;

a pair of first outer electrode layers formed on the outer peripheral sides, respectively, of the piezoelectric device for the injector in such a manner that adjacent ones of said outer electrode layers alternately assume electrically positive and negative polarities; and metal members coupled to said first outer electrode layers, respectively, through second outer electrode layers of a conductive material having a larger breaking elongation than said first outer electrode layers;

wherein said metal members are each formed of a metal plate having slits or holes; and said slits are formed diagonally over said piezoelectric layers and said inner electrode layers constituting said piezoelectric device.

19. A stack type of piezoelectric device built in an injector, wherein outer electrodes are arranged on the sides of said piezoelectric device, and external electrodes are arranged on said outer electrodes, respectively, for establishing electric conduction with external parts, wherein said external electrodes each include a core member and a metal cover for covering at least a part of said core member, said external electrodes being coupled to at least a part of said outer electrodes, and wherein the specific electric resistance of said core member is not less than $5\times10^{-6}$ ($\Omega\cdot$cm), and the specific electric resistance of the said metal cover is not more than one half of that of said core member.

20. A piezoelectric device for an injector, according to claim 19, in which said core member is a metal material having a tensile strength of not less than 500 MPa.

21. A piezoelectric device for an injector, according to claim 19, in which said core member is made of a selected one of SUS, beryllium copper, phosphor bronze and nickel silver.

22. A piezoelectric device for an injector, according to claim 19, in which said metal cover is made of a selected one of silver, gold and copper.

23. A piezoelectric device for an injector, according to claim 19, in which said metal cover is arranged in such a manner as to cover at least 30% of the surface area of said core member.

24. A stack type of piezoelectric device built in an injector, wherein outer electrodes are arranged on the sides of said piezoelectric device, and external electrodes are arranged on said outer electrodes, respectively, for establishing electric conduction with external parts, wherein said external electrodes each include a core member and a metal cover for covering at least a part of said core member, said external electrodes being coupled to at least a part of said outer electrodes, and wherein the specific electric resistance of said core member is not less than $5\times10^{-6}$ ($\Omega\cdot$cm), and the specific electric resistance of the said metal cover is not more than one half of that of said core member; and a substrate material is interposed for improving the closeness between said core member and said metal cover.

25. A stack type of piezoelectric device built in an injector, wherein outer electrodes are arranged on the sides of said piezoelectric device, and external electrodes are arranged on said outer electrodes, respectively, for establishing electric conduction with external parts, wherein said external electrodes each include a core member and a metal cover for covering at least a part of said core member, said external electrodes being coupled to at least a part of said outer electrodes, and wherein the specific electric resistance of said core member is not less than $5\times10^{-6}$ ($\Omega\cdot$cm), and the specific electric resistance of the said metal cover is not more than one half of that of said core member; and said outer electrodes are made of a conductive adhesive containing silver, and at least one of said metal covers is arranged at least on the joint surface between said external electrode and said conductive adhesive.

26. A stack type of piezoelectric device built in an injector, wherein outer electrodes are arranged on the sides of said piezoelectric device, and external electrodes are arranged on said outer electrodes, respectively, for establishing electric conduction with external parts, wherein said external electrodes each include a core member and a metal cover for covering at least a part of said core member, said external electrodes being coupled to at least a part of said outer electrodes, and wherein the specific electric resistance of said core member is not less than $5\times10^{-6}$ ($\Omega\cdot$cm), and the specific electric resistance of the said metal cover is not more than one half of that of said core member; and each of said outer electrodes and the corresponding one of said external electrodes are coupled to each other by a conductive adhesive containing silver, and said metal cover is arranged at least on the joint surface between said external electrode and said conductive adhesive.

* * * * *